US007071530B1

(12) United States Patent
Ding et al.

(10) Patent No.: US 7,071,530 B1
(45) Date of Patent: Jul. 4, 2006

(54) MULTIPLE LAYER STRUCTURE FOR SUBSTRATE NOISE ISOLATION

(75) Inventors: Hanyi Ding, Essex Junction, VT (US); Kai D. Feng, Essex Junction, VT (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,934

(22) Filed: Jan. 27, 2005

(51) Int. Cl.
*H01L 21/762* (2006.01)

(52) U.S. Cl. ............... 257/508; 257/630; 257/659; 257/E21.546; 438/404; 438/406

(58) Field of Classification Search ........... 438/404, 438/406, FOR. 267; 257/508, 630, 659, 257/E21.546
See application file for complete search history.

(56) References Cited

U.S. PATENT DOCUMENTS

| | | | | |
|---|---|---|---|---|
| 3,920,493 A | * | 11/1975 | Kravitz | 438/350 |
| 4,963,505 A | * | 10/1990 | Fujii et al. | 438/405 |
| 5,151,769 A | * | 9/1992 | Immorlica et al. | 257/659 |
| 5,196,373 A | * | 3/1993 | Beasom | 438/404 |
| 5,268,326 A | * | 12/1993 | Lesk et al. | 438/406 |
| 5,403,769 A | * | 4/1995 | Fujii | 438/405 |
| 5,442,223 A | * | 8/1995 | Fujii | 257/506 |
| 5,475,255 A | | 12/1995 | Joardar et al. | |
| 5,491,358 A | | 2/1996 | Miyata | |
| 5,622,890 A | * | 4/1997 | Beasom et al. | 438/404 |
| 5,644,157 A | * | 7/1997 | Iida et al. | 257/510 |
| 5,767,561 A | | 6/1998 | Frei et al. | |
| 5,920,108 A | * | 7/1999 | Hemmenway et al. | 257/508 |
| 5,939,755 A | * | 8/1999 | Takeuchi et al. | 257/347 |
| 6,127,701 A | * | 10/2000 | Disney | 257/338 |
| 6,291,322 B1 | | 9/2001 | Clement | |
| 6,424,022 B1 | | 7/2002 | Wu et al. | |
| 6,432,754 B1 | | 8/2002 | Assaderaghi et al. | |
| 6,438,733 B1 | | 8/2002 | Clement | |
| 6,459,134 B1 | | 10/2002 | Ohguro et al. | |
| 6,514,799 B1 | | 2/2003 | Litwan et al. | |
| 6,617,649 B1 | | 9/2003 | Chang et al. | |
| 6,645,795 B1 | | 11/2003 | Muller et al. | |
| 6,657,241 B1 | | 12/2003 | Rouse et al. | |
| 6,657,285 B1 | | 12/2003 | Cheng et al. | |
| 6,690,066 B1 | | 2/2004 | Lin et al. | |
| 6,787,410 B1 | * | 9/2004 | Iwata et al. | 438/221 |
| 6,838,362 B1 | * | 1/2005 | Mastromatteo et al. | 438/524 |
| 6,844,236 B1 | * | 1/2005 | Ivanov et al. | 438/406 |
| 2001/0028096 A1 | | 10/2001 | Ohguro et al. | |
| 2002/0009837 A1 | * | 1/2002 | Iwamatsu et al. | 438/151 |
| 2004/0038542 A1 | | 2/2004 | Chan et al. | |

* cited by examiner

*Primary Examiner*—George Fourson
(74) *Attorney, Agent, or Firm*—Schmeiser, Olsen & Watts; Williams D. Sabo

(57) ABSTRACT

A method of forming a semiconductor structure, comprising: providing a substrate having a buried insulative layer and a heavily doped layer; forming a first trench within the substrate around a protected area; filling the first trench with an insulative material, wherein the first trench filled with the insulative material and the buried insulative layer combine to form a high impedance noise isolation that surrounds the protected area on all sides except one side of the protected area to isolate noise from the protected area; forming a second trench within the substrate around the first trench; and filling the second trench with a conductive material, wherein the second trench filled with the conductive material and the heavily doped layer combine to form a low impedance ground path that surrounds the high impedance noise isolation on all sides except one side of the high impedance noise isolation to isolate noise from the protected area.

20 Claims, 17 Drawing Sheets

US 7,071,530 B1

MULTIPLE LAYER STRUCTURE FOR SUBSTRATE NOISE ISOLATION

BACKGROUND OF THE INVENTION

1. Technical Field

The present invention relates generally to semiconductor structures, and more particularly, to a method of forming a structure for noise isolation, and the structure so formed.

2. Related Art

Within electrical devices there are device elements that generate noise, such as digital circuits, and others that are noise sensitive, such as analog circuits. Noise generated by the digital circuits interferes with the proper functioning of the analog circuits.

Therefore, there is a need in the industry for a method of forming semiconductor structures that can isolate or filter out the noise, generated by the digital circuits, from reaching and disrupting the more sensitive analog circuits.

SUMMARY OF THE INVENTION

The present invention provides a method of forming semiconductor structures, and the structures so formed, that solve the above-stated and other problems.

A first aspect of the invention provides a method of forming a semiconductor structure, comprising: providing a substrate having a buried insulative layer; depositing a heavily doped layer within the substrate beneath the buried insulative layer; forming a first trench within the substrate around a protected area; filling the first trench with an insulative material, wherein the first trench filled with the insulative material and the buried insulative layer combine to form a high impedance noise isolation that surrounds the protected area on all sides except one side of the protected area; forming a second trench within the substrate around the first trench; and filling the second trench with a conductive material, wherein the second trench filled with the conductive material and the heavily doped layer combine to form a low impedance ground path that surrounds the high impedance noise isolation and the protected area on all sides except one side of the high impedance noise isolation.

A second aspect of the invention provides a method of forming a semiconductor structure, comprising: providing a substrate having a protected area within the substrate; and forming a noise reduction isolation within the substrate, wherein the noise reduction isolation surrounds the protected area on all sides except one side of the protected area.

A third aspect of the invention provides a semiconductor structure, comprising: a noise reduction isolation formed within a substrate, wherein the noise reduction isolation surrounds a protected area on all sides except one side of the protected area.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
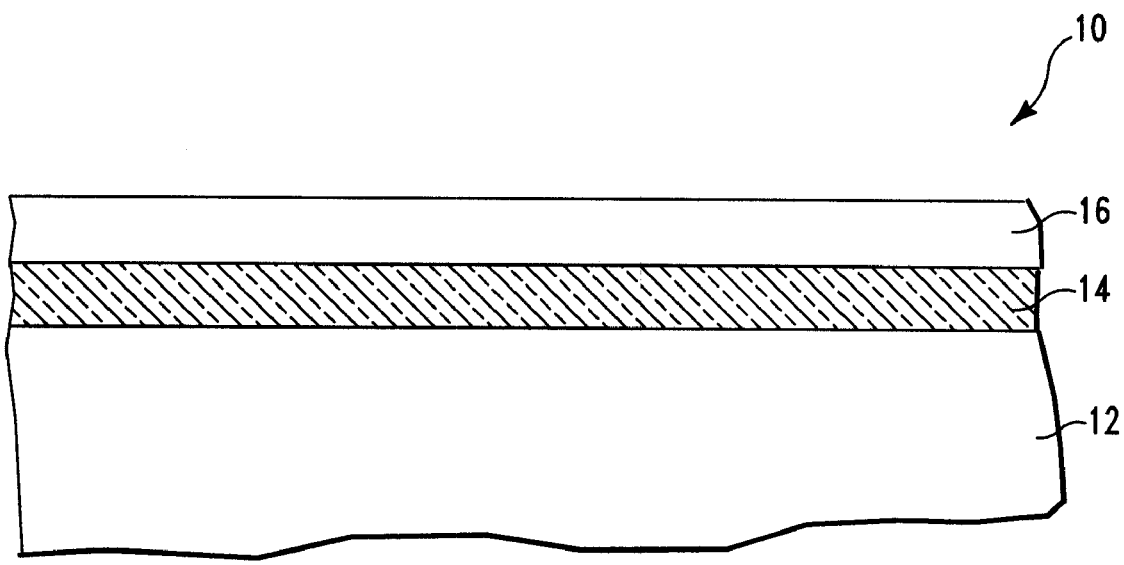
FIG. 1 depicts a cross-sectional view of a structure comprising a silicon-on-insulator (SOI) substrate, in accordance with embodiments of the present invention.

FIG. 1 depicts a semiconductor structure 10 comprising an SOI (silicon-on-insulator) substrate. The SOI 10 comprises a semi-conductive substrate 12, such as silicon (p type or n type), etc., a buried oxide layer 14, such as silicon dioxide, and an upper semi-conductive layer 16 above the buried oxide layer 14, that may comprise the same material as the substrate 12. The buried oxide layer 14 may be formed having a thickness in the range of about 30–200 nm. The upper semi-conductive layer 16 may be formed having a thickness in the range of about 30–100 nm.

The SOI 10 may be formed using a method known as SIMOX (silicon implanted oxygen), wherein oxygen ions are implanted into the substrate 12, followed by a high temperature annealing process to form a buried oxide layer 14, e.g., silicon dioxide ($SiO_2 2$), beneath an upper semi-conductive layer 16 of the substrate. Alternatively, the buried oxide layer 14 may be formed using a bonded wafer technique, wherein a thin layer of $SiO_2$ is formed on a first side of two silicon wafers. The first sides of the two wafers are then bonded together at a certain temperature, for example, about 250–350° C., or bonded using other methods as known in the art.

Figure 2:
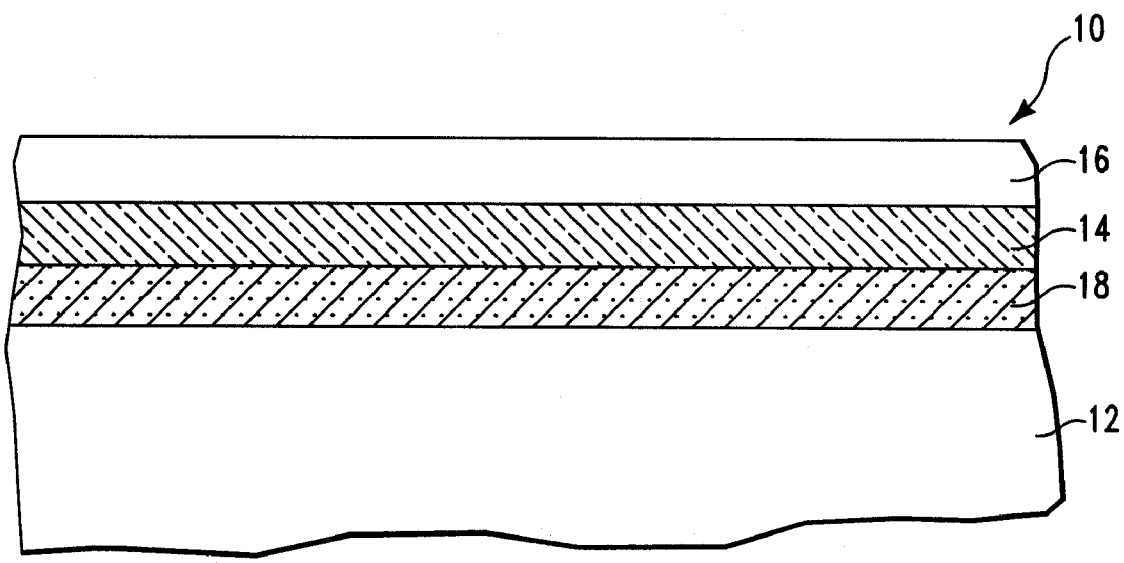
FIG. 2 depicts the structure of FIG. 1 having a heavily doped layer formed within the SOI.

As illustrated in FIG. 2, a heavily doped layer 18 is formed within the substrate 12 of the SOI 10 beneath the buried oxide layer 14. The heavily doped layer 18 may comprise silicon doped with As, P, B, etc., (all of which may be p+ or n+ type), or other similarly used material. The heavily doped layer 18 may be formed having a thickness in the range of about 10–500 nm. The term "heavily doped" refers to a dopant density of about $1-10^1$ to $7 \times 10^{20}$ $cm^{-3}$.

The heavily doped layer 18 may be formed using a conventional ion implantation technique, etc. Alternatively, the heavily doped layer 18 may be formed using an epitaxy layer growth technique, wherein a heavily doped epitaxy layer is grown on the surface of a first silicon wafer. A silicon dioxide layer, representing the buried oxide layer 14, is then formed on the heavily doped layer, and a second silicon wafer, representing the upper semi-conductive layer 16, is then bonded to the surface of the silicon dioxide, thereby forming an SOI with a heavily doped layer therein.

Figure 3:
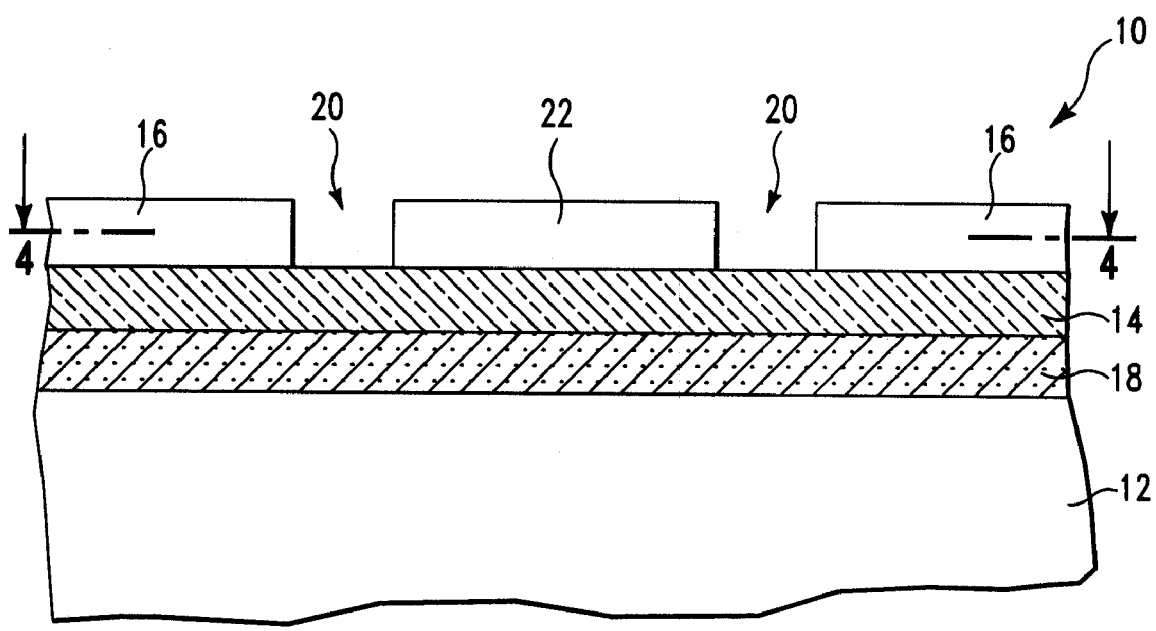
FIG. 3 depicts the structure of FIG. 2 following formation of a first trench.
Figure 4:
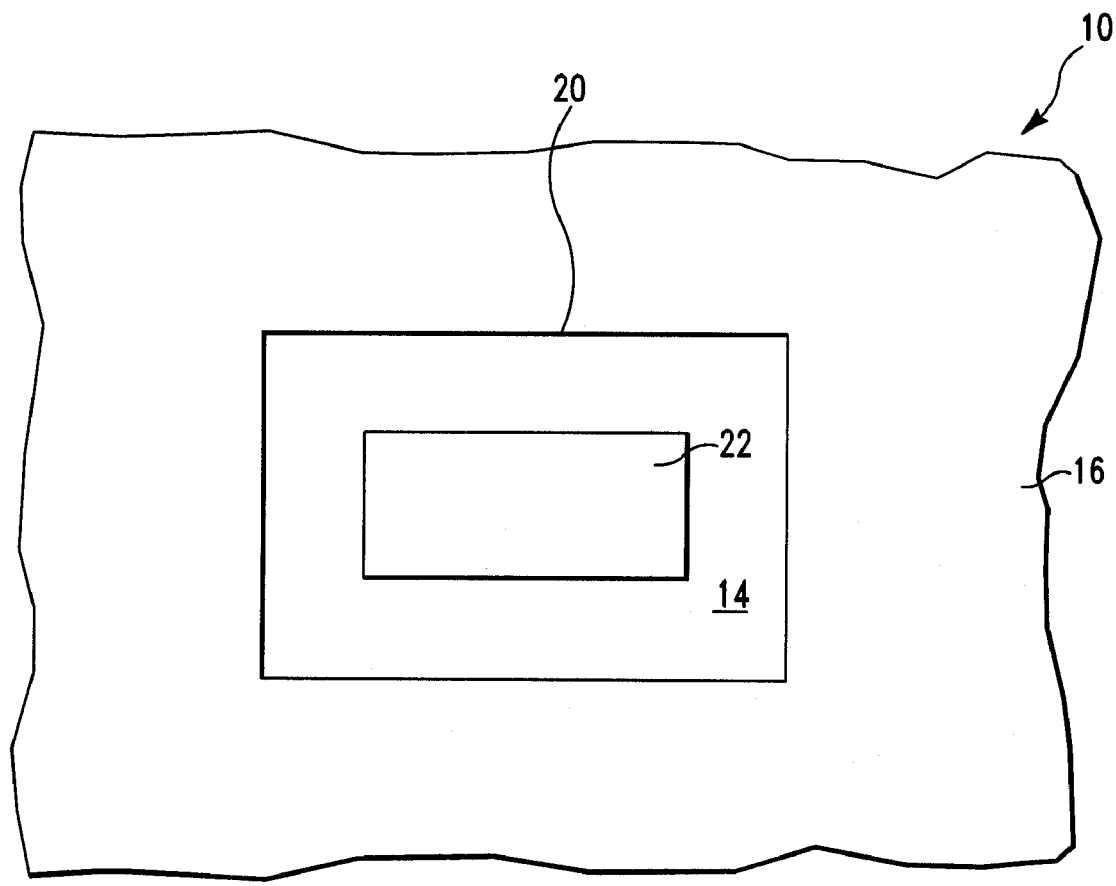
FIG. 4 depicts a top view of the structure of FIG. 3 following formation of the first trench.

A first trench 20, shown in FIG. 3, for example, a shallow trench isolation (STI), is formed within the upper semi-conductive layer 16 of the SOI 10, down to the buried oxide layer 14, such that the first trench 20 surrounds a protected area 22 that will later be the location for a noise sensitive circuits. FIG. 3 depicts a cross-sectional view, while FIG. 4 shows a top view of the first trench 20 and the protected area 22.

Figure 5:
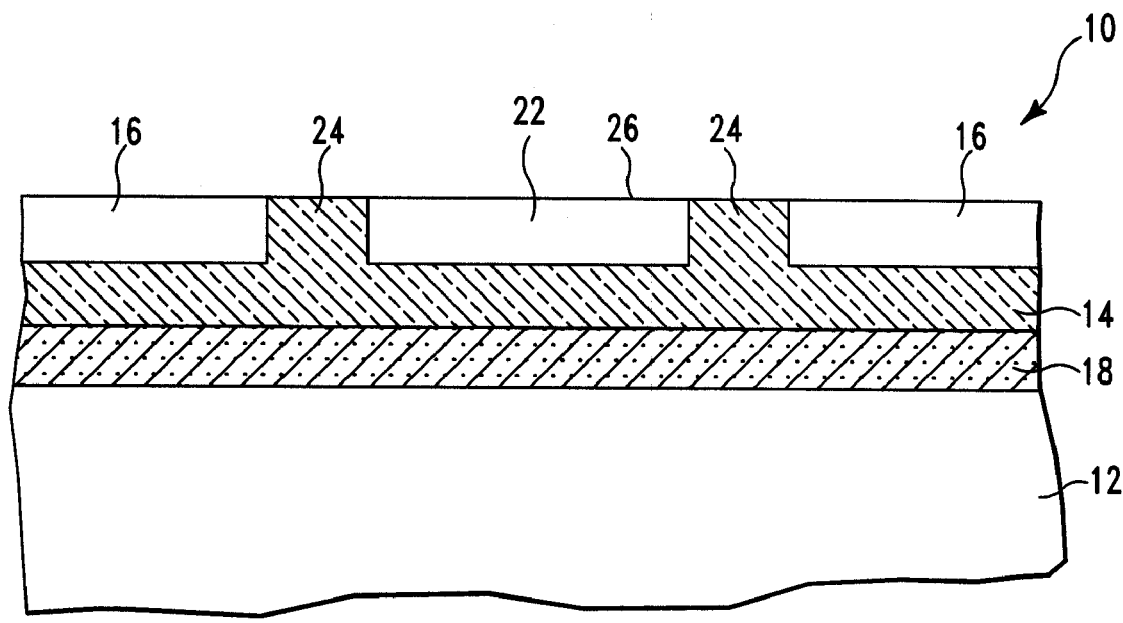
FIG. 5 depicts the structure of FIG. 3 following deposition of an insulative material.

A layer of insulative material, such as silicon dioxide, or other similarly used material, is then deposited over the surface of the structure 10 filling the first trench 20. The surface of the structure 10 is planarized down to the surface of the upper semi-conductive layer 16 using a chemical mechanical polishing (CMP) technique, or other similar technique, leaving the insulative material within the first trench 20, as illustrated in FIG. 5. The insulative material within the first trench 20 (FIG. 3) and within the buried oxide layer 14 combine to form a high impedance noise isolation 24 that surrounds the protected area 22 on all sides or surfaces except one side or surfaces 26, in this example, on the bottom surface and on all four walls of the protected area, (FIGS. 4 and 5).

Figure 6:
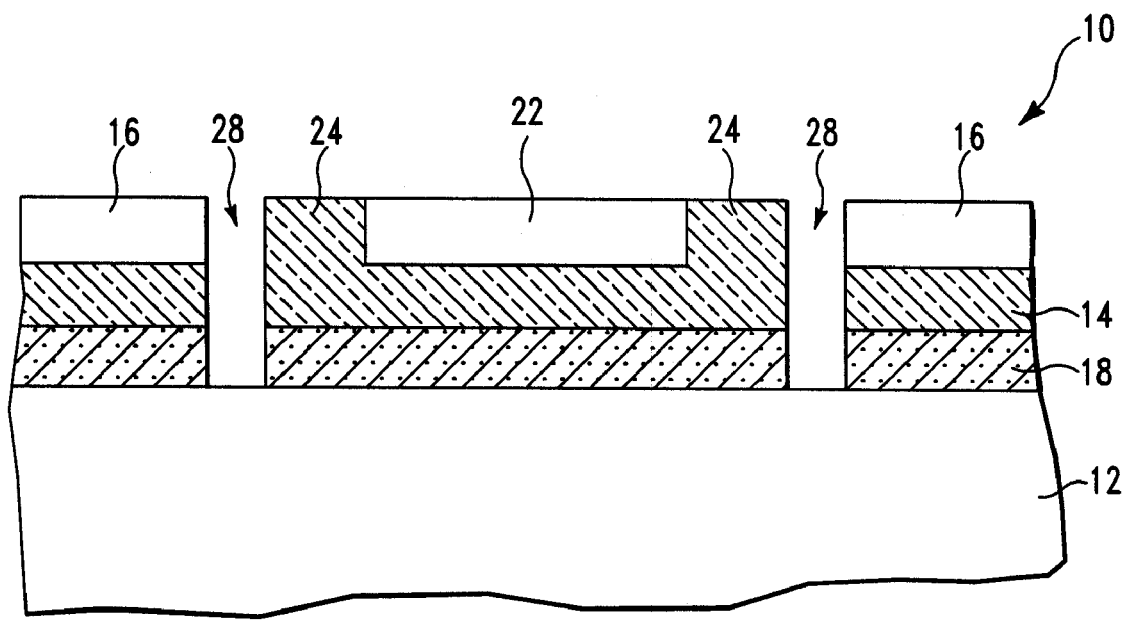
FIG. 6 depicts the structure of FIG. 5 following formation of a second trench.
Figure 7:
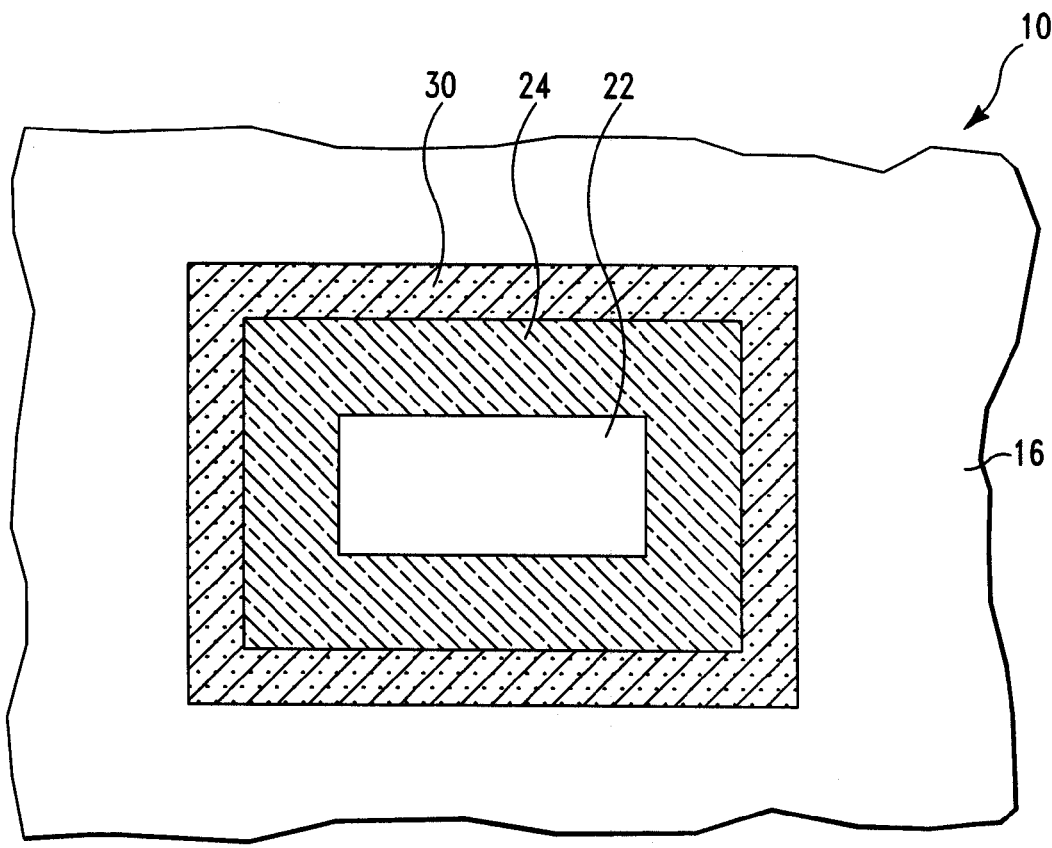
FIG. 7 depicts a top view of the structure of FIG. 6 following formation of the second trench.
Figure 8:
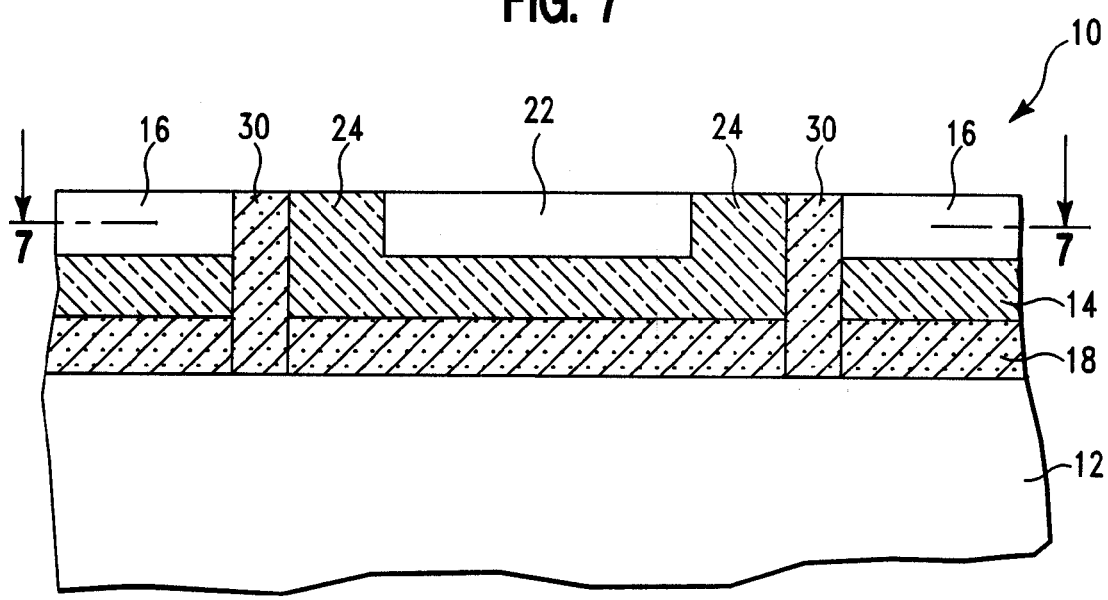
FIG. 8 depicts the structure of FIG. 6 following deposition of a conductive material.

A second trench 28 is then formed around the perimeter of the high impedance noise isolation 24, as illustrated in FIG. 6. The second trench 28 is formed by lithographically patterning and dry etching, e.g., reactive ion etching (RIE), etc., the upper semi-conductive layer 16 of the SOI 10, the buried oxide layer 14 and the heavily doped layer 18, down to the substrate 12. The second trench 28 is then filled with a heavily doped material, such as silicon doped with As, P, B, etc., or a conductive material, e.g., tungsten, subject to a different process sequence. The surface of the structure 10 is planarized down to the surface of the upper semi-conductive layer 16 of the structure 10 using a CMP, or other similar technique. The combination of the trench filled with the heavily doped material, or the conductive material, and the heavily doped layer 18 forms a low impedance noise ground path 30 that surrounds the high impedance noise isolation 24 on all sides or surfaces of the high impedance noise isolation 24, as well as the protected area 22, except one side 26, in this example, on the bottom and on the four walls of the high impedance noise isolation 24, (FIG. 7, a top view, and FIG. 8, a cross-sectional view).

It should be noted that the second trench 28 filled with the heavily doped material or the conductive material may also be formed during stud contact formation such that many processing steps can be shared with stud contact formation, thereby minimizing manufacturing costs.

It should also be noted that the term "isolation" as used in the present invention describes a region that isolates the protected area 22 from incoming noise. In the current example, the low impedance ground path 30 is connected to 0V, to bypass the noise to ground. The high impedance noise isolation 24 stops residual noise that gets past the low impedance ground path 30. The combination of the high impedance isolation 24 and the low impedance ground path 30 on all sides or surfaces of the protected area 22, except for one side 26, in this example, on the bottom and four walls, provides a high degree of noise reduction to the protected area 22.

In the previous example the substrate 12 and the heavily doped layer 18 could be either p+ or n+ type materials. In the alternative, if the substrate 12 comprises p– silicon, and the heavily doped layer 18 and the second trench 28 comprise an n+ poly silicon, or the second trench can be filled with conductive material, the low impedance ground path 30 would be connected to +V, rather than 0V. In addition, the existence of the p– substrate 12 adjacent to the n+ heavily doped layer 18 forms what is referred to as a depletion layer 32, (FIG. 8), wherein there is no movable charge in the depletion layer 32 between the p– substrate 12 and the n+ heavily doped layer 18 due to the reversed bias voltage V+. This further reduces low frequency substrate noise within the structure 10 because of the high impedance of the depletion layer 32 at the low frequency.

Figure 9:
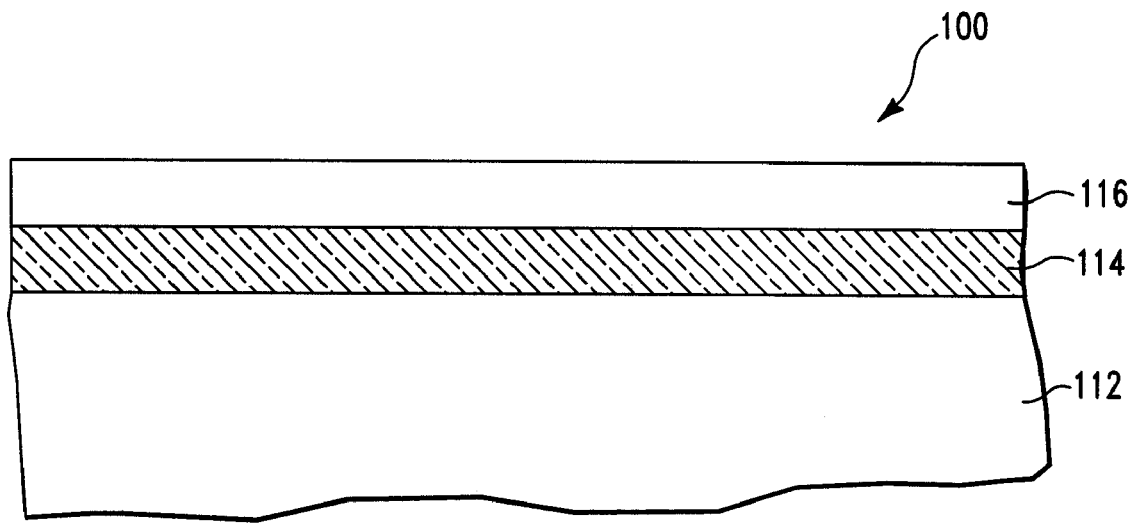
FIG. 9 depicts a cross-sectional view of a structure comprising a silicon-on-insulator (SOI) substrate, in accordance with a second embodiment of the present invention.
Figure 10:
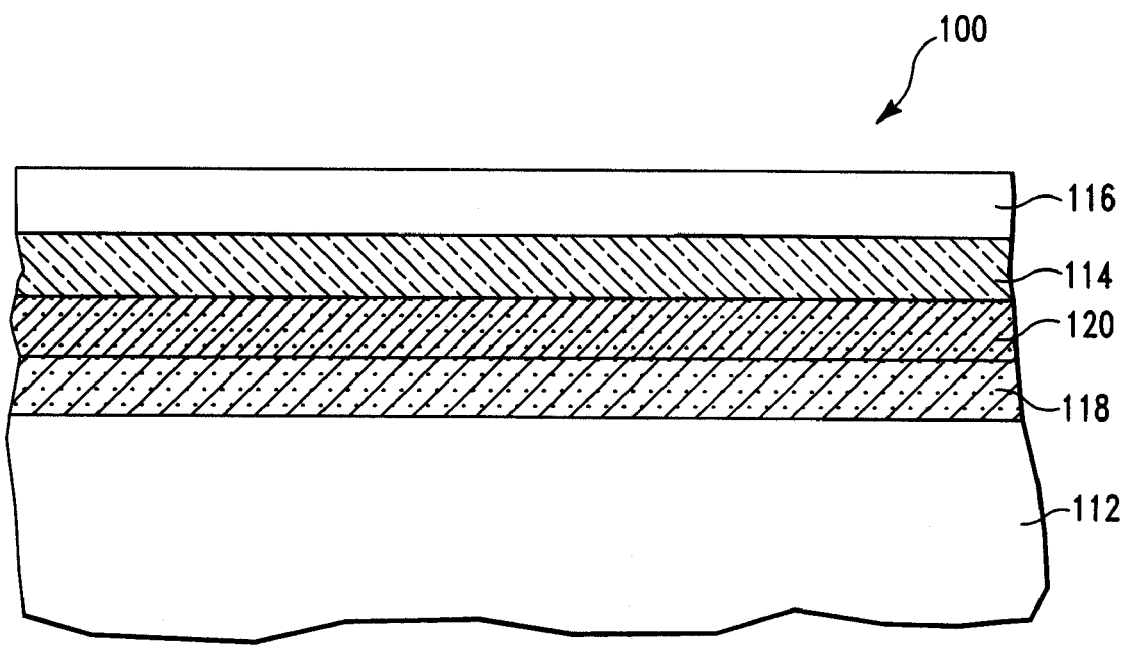
FIG. 10 depicts the structure of FIG. 9 following formation of two heavily doped layers within the SOI.

In accordance with a second embodiment, an SOI 100 comprising a semi-conductive substrate 112, such as silicon (p– or n–), a buried oxide layer 114, such as silicon dioxide, and an upper semi-conductive layer 116 above the buried oxide layer 114, that may comprise the same, or a similar, material as the substrate 112, is formed (FIG. 9). Following formation of the SOI 100, a first heavily doped layer 118 is formed within the SOI 100, beneath the buried oxide layer 114, as illustrated in FIG. 10. The first heavily doped layer 118 may comprise a p+ silicon doped with B, or other similarly used material. The first heavily doped layer 11.8 may be formed by a conventional ion implantation process, etc. The first heavily doped layer 118 may be formed having a thickness in the range of about 10–500 nm.

Also illustrated in FIG. 10, a second heavily doped layer 120 is formed within the SOI 100, beneath the buried oxide layer 114 and above the first heavily doped layer 118. The second heavily doped layer 120 may comprise an n+ silicon doped with As, P, or other similarly used material. The second heavily doped layer 120 may also be formed by a conventional ion implantation process, etc. The second heavily doped layer 120 may be formed having a thickness in the range of about 10–500 nm.

Figure 11:
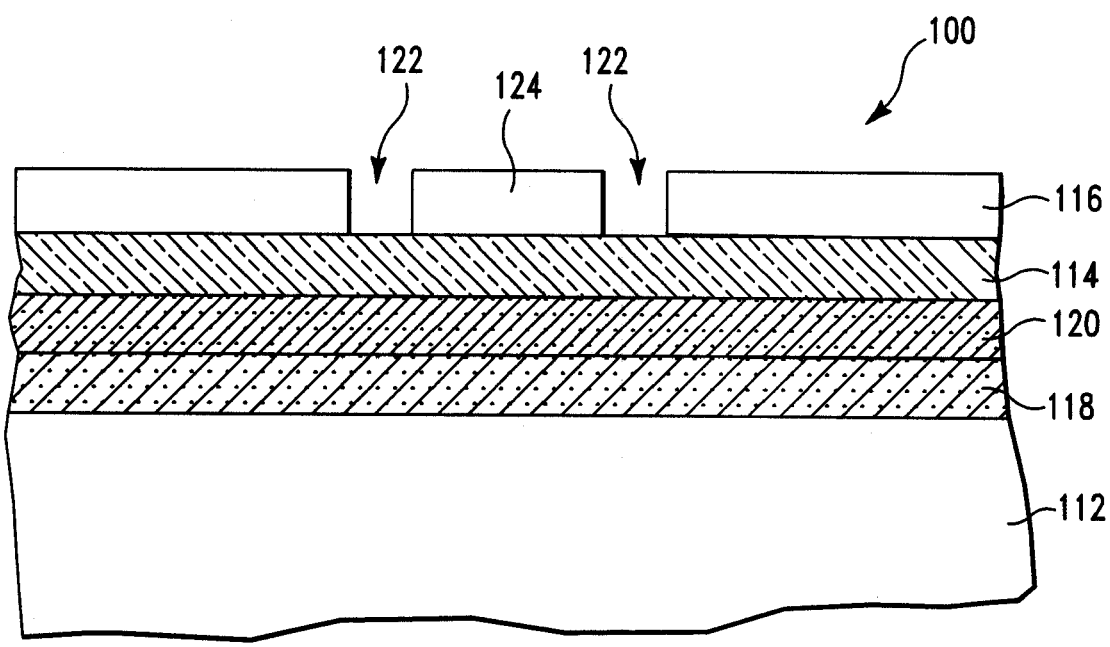
FIG. 11 depicts the structure of FIG. 10 following formation of a first trench.

A first trench 122, for example, a shallow trench isolation (STI), is formed within the upper semi-conductive layer 116 of the SOI 100, down to the buried oxide layer 114, such that the first trench 122 surrounds a protected area 124 that will later be the location for noise sensitive circuits. FIG. 11 depicts a cross-sectional view of the first trench 122 and the protected area 124, while FIG. 12 shows a top view of the first trench 122 and the protected area 124.

Figure 12:
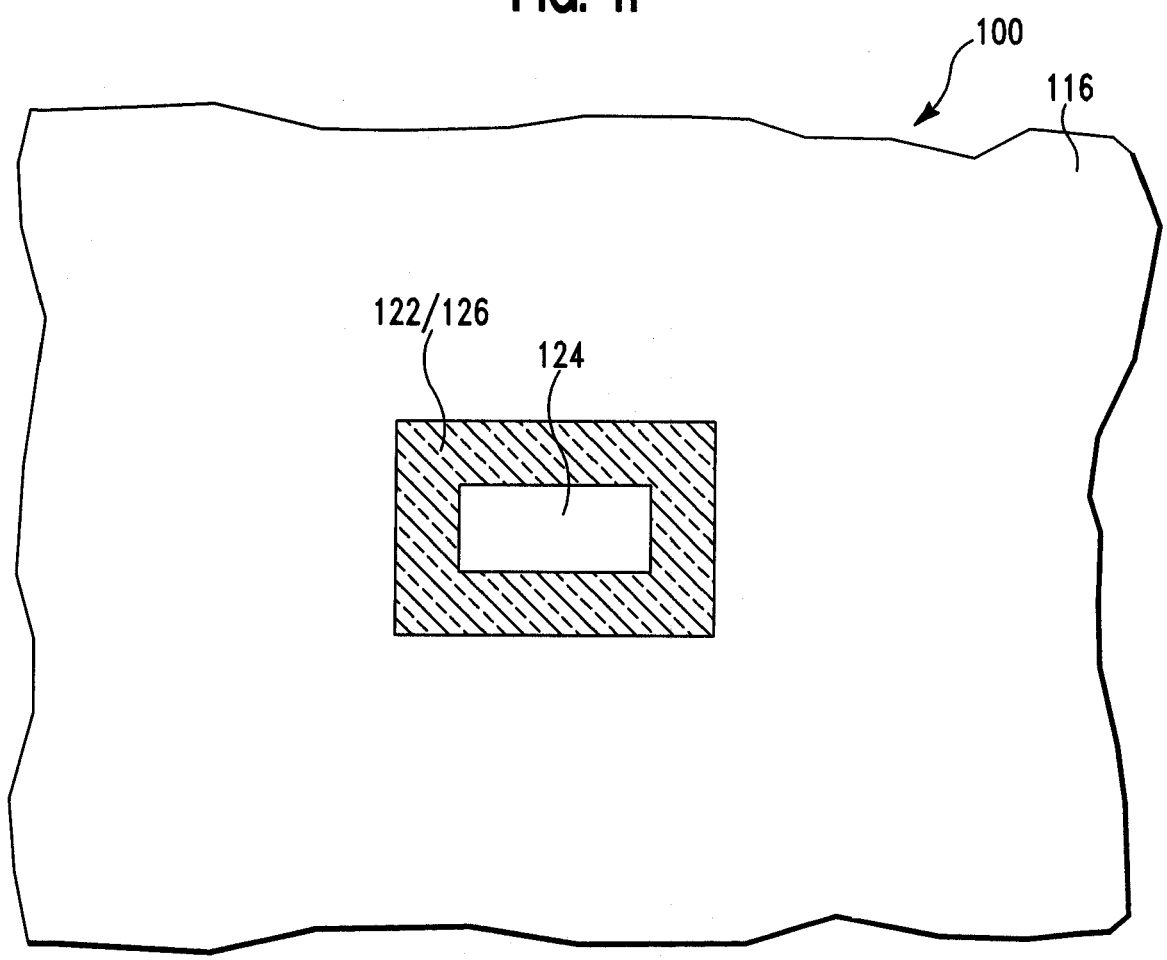
FIG. 12 depicts a top view of the structure of FIG. 11 following formation of the first trench.
Figure 13:
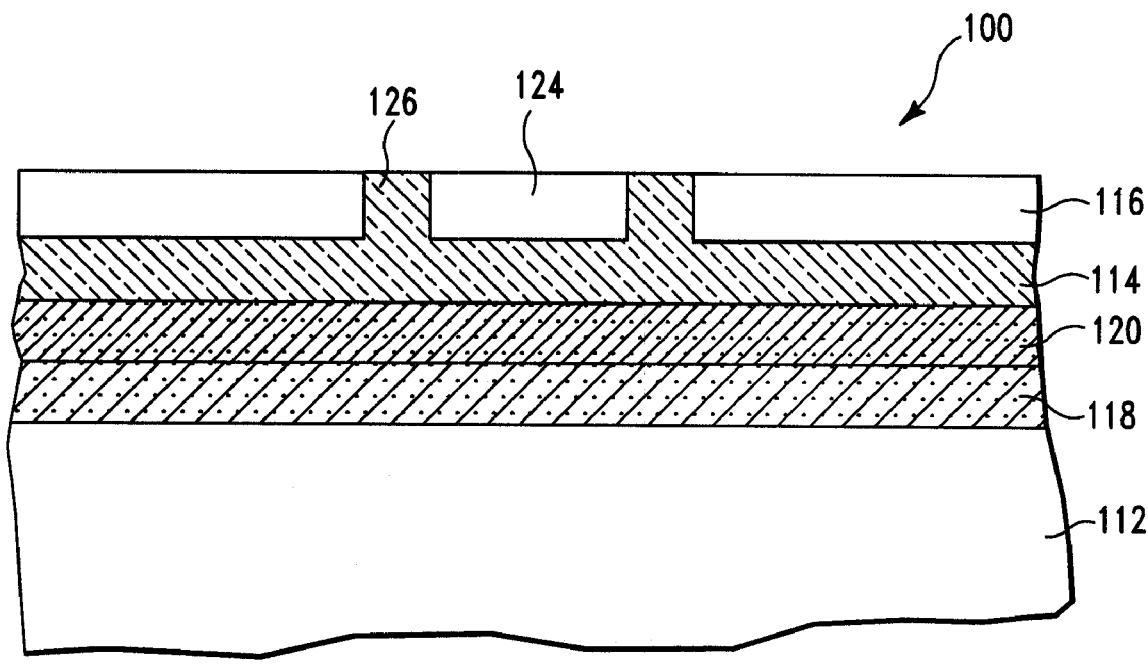
FIG. 13 depicts the structure of FIG. 12 following deposition of an insulative material.

A layer of insulative material, such as silicon dioxide, or other similarly used material, is then deposited over the surface of the structure filling the first trench 122, as illustrated in FIGS. 11 and 12. The layer 122 is planarized down to the surface of the upper semi-conductive layer 116 of the SOI 100 using CMP, or other similar technique, leaving the insulative material within the first trench 122. The insulative material within the first trench 122 and within the buried oxide layer 144 combine to form a high impedance noise isolation 126 that surrounds the protected area 124 on all sides or surfaces except one side 130, in this example, on the bottom and the four walls of the protected area 124, (FIGS. 12 and 13).

Figure 14:
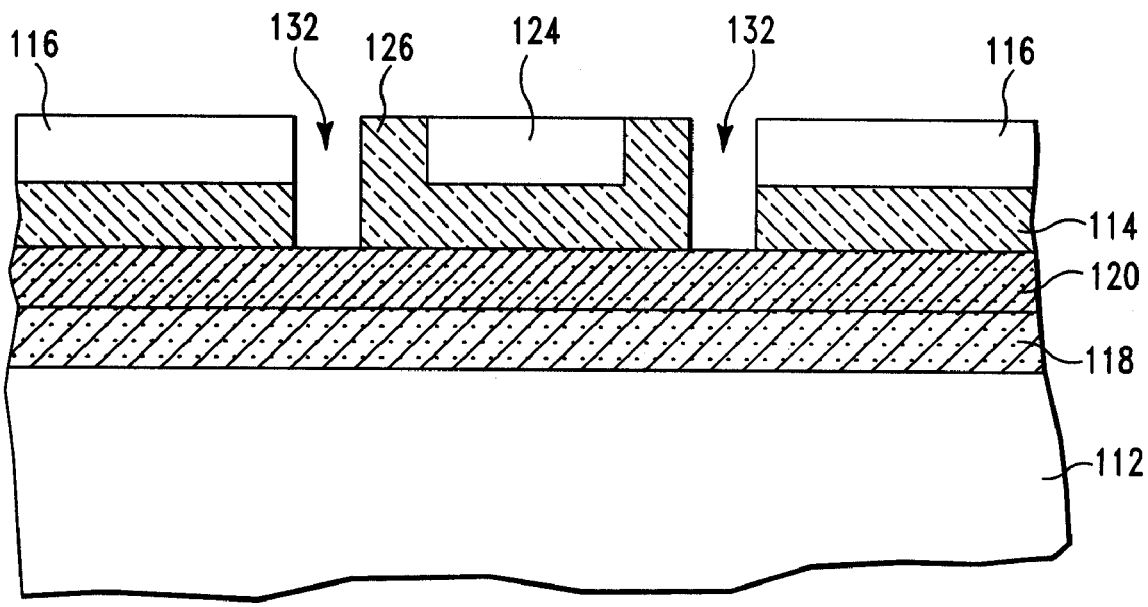
FIG. 14 depicts the structure of FIG. 13 following formation of a second trench.
Figure 15:
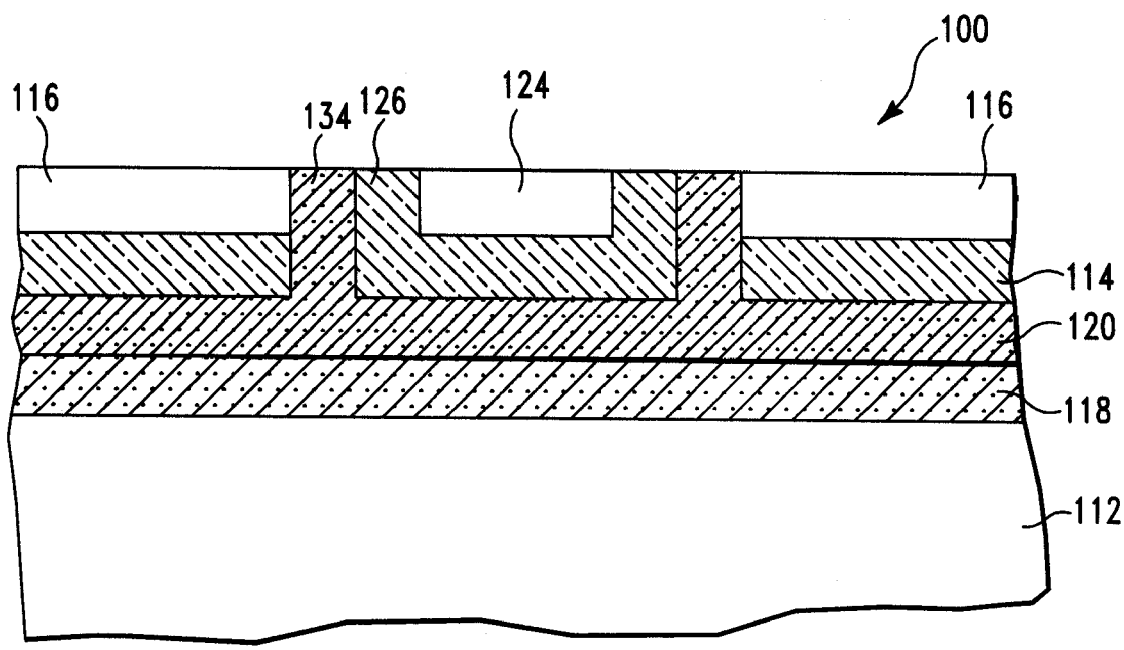
FIG. 15 depicts the structure of FIG. 14 following deposition of a heavily doped material.
Figure 16:
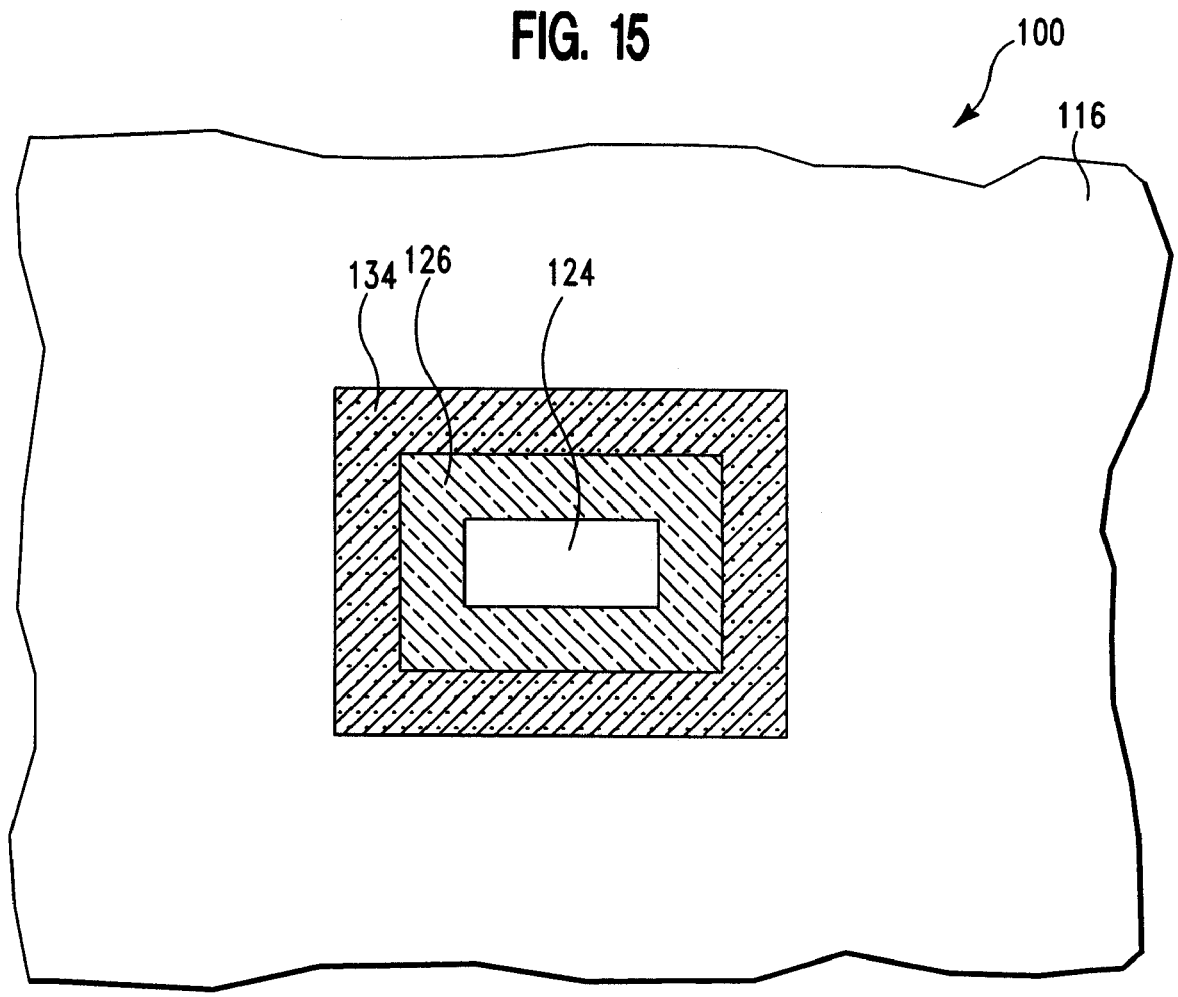
FIG. 16 depicts a top view of the structure of FIG. 15 following deposition of the heavily doped material.

A second trench 132 is formed around the perimeter of the high impedance noise isolation 126, as illustrated in FIG. 14. The second trench 132 is formed by lithographically patterning and dry etching, e.g., RIE, etc., the upper semi-conductive layer 116 of the SOI 100 and the buried oxide layer 114, stopping at the second heavily doped layer 120. The second trench 132 is then filled with a heavily doped material, such as n+ silicon doped with As, P, etc., or conductive material, e.g. tungsten, etc. The layer 132 is planarized down to the surface of the upper semi-conductive layer 116 of the structure using a CMP, or other similar technique. The combination of the second trench 132 filled with heavily doped material or the conductive material and the heavily doped layer 120 form a first low impedance ground path 134 that surrounds the high impedance noise isolation 126 on all sides or surfaces except one side 130, in this example, on the bottom and four walls of the high impedance noise isolation 126, which in tern surrounds the bottom and four walls of the protected area 124, (FIG. 15, a cross-sectional view; and FIG. 16, a top view).

Figure 17:
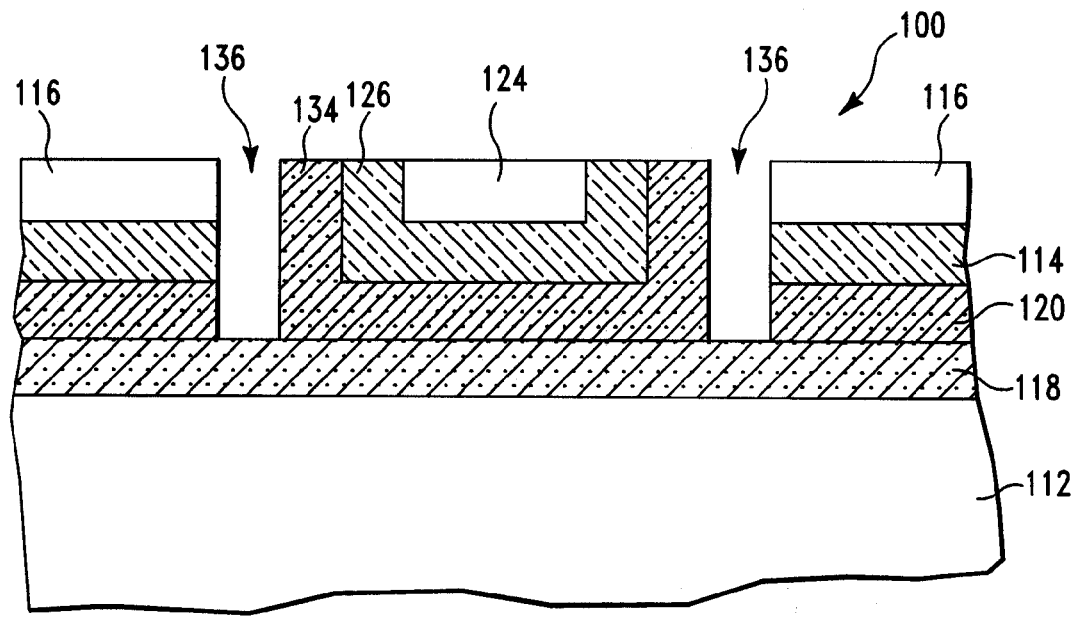
FIG. 17 depicts the structure of FIG. 15 following formation of a third trench.
Figure 18:
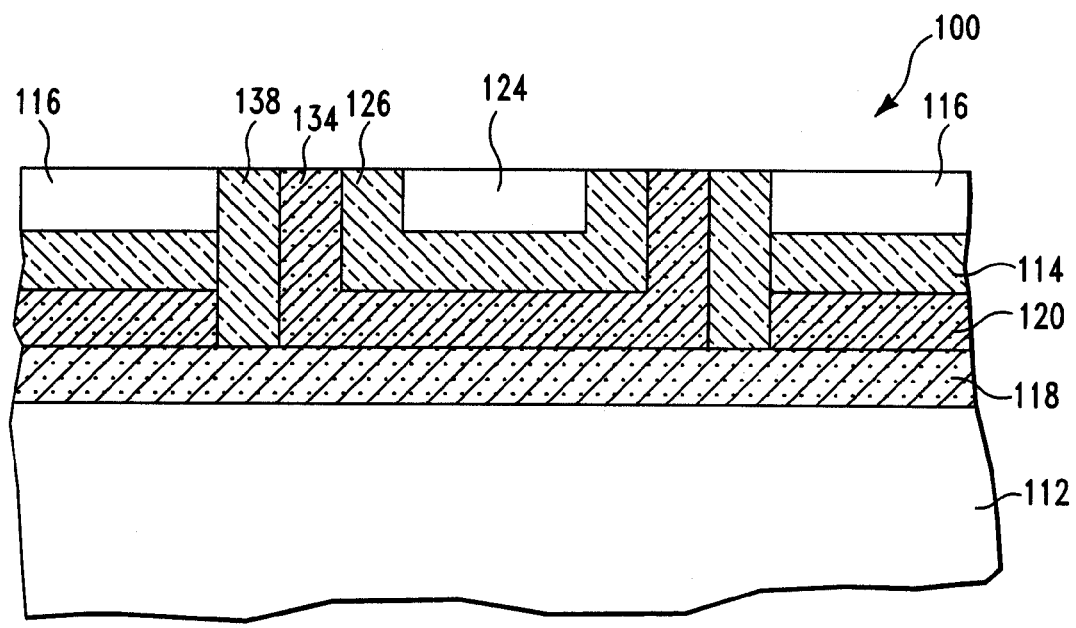
FIG. 18 depicts the structure of FIG. 17, following deposition of an insulative material.
Figure 19:
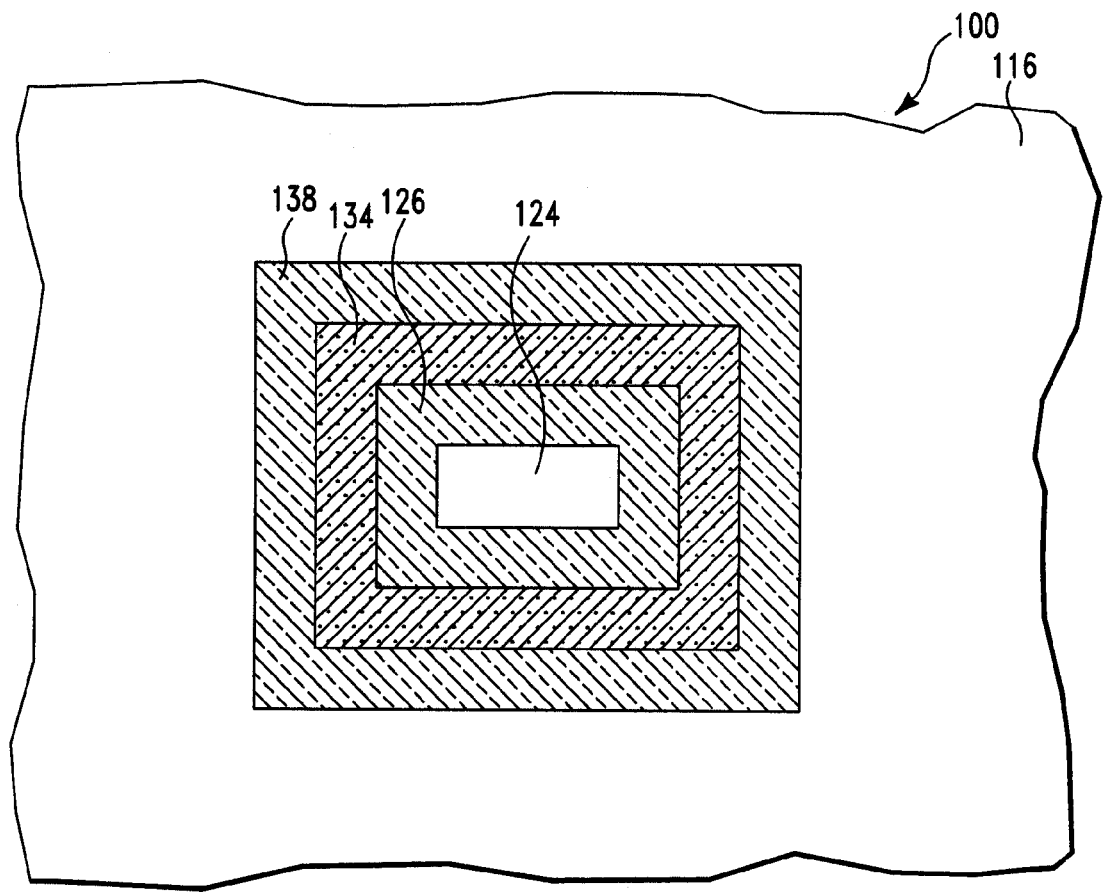
FIG. 19 depicts a top view of the structure of FIG. 18 following deposition of the insulative material.

A third trench 136 is formed around the perimeter of the first low impedance ground path 134, as illustrated in FIG. 17. The third trench 136 is formed by lithographically patterning and dry etching, e.g., RIE, etc., the upper semi-conductive layer 116 of the SOI 100, the buried oxide layer 114 and the second heavily doped layer 120, down to, and stopping at, the first heavily doped layer 118. The third trench 136 is then filled with an insulative material, such as $SiO_2$, etc. The surface of the structure is planarized down to the surface of the upper semi-conductive layer 116 of the structure using a CMP, or other similar technique, to form a second high impedance noise isolation 138, (FIG. 18, a cross-sectional view; and FIG. 19, a top view).

Figure 20:
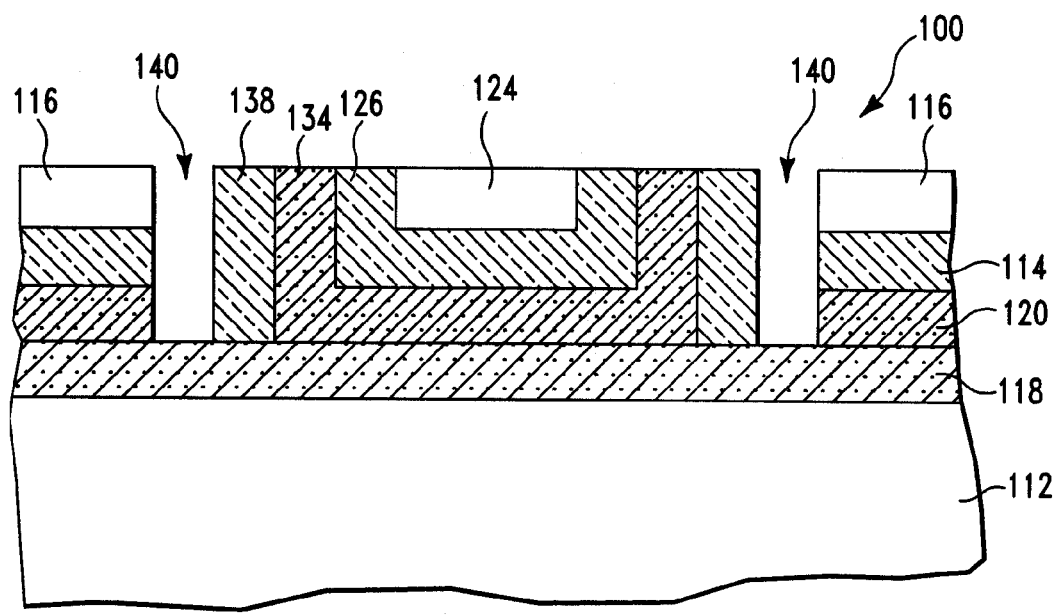
FIG. 20 depicts the structure of FIG. 18 following formation of a fourth trench.
Figure 21:
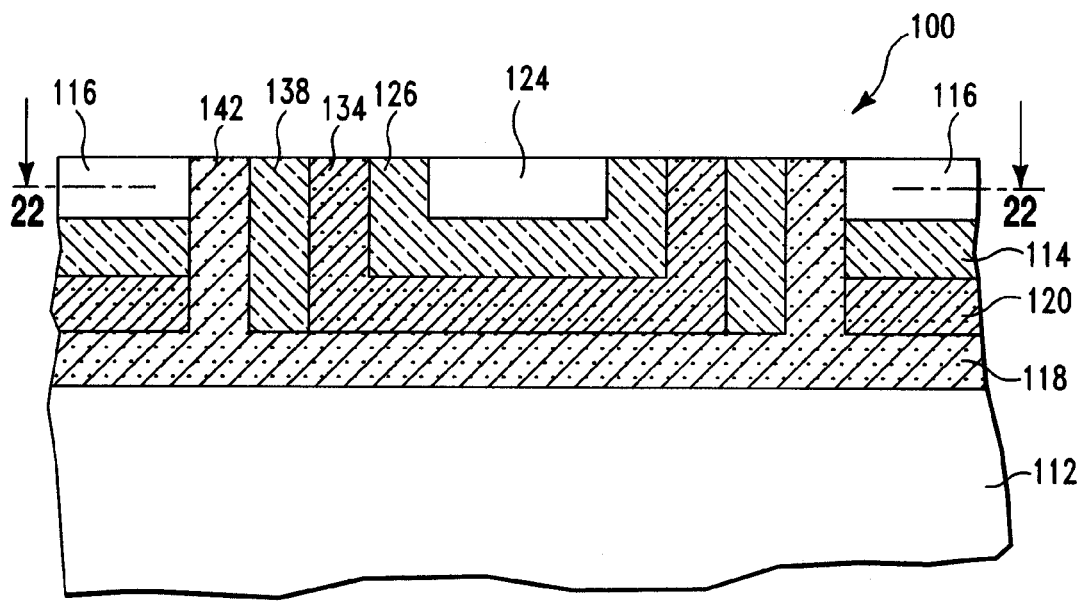
FIG. 21 depicts the structure of FIG. 20 following deposition of a heavily doped material.
Figure 22:
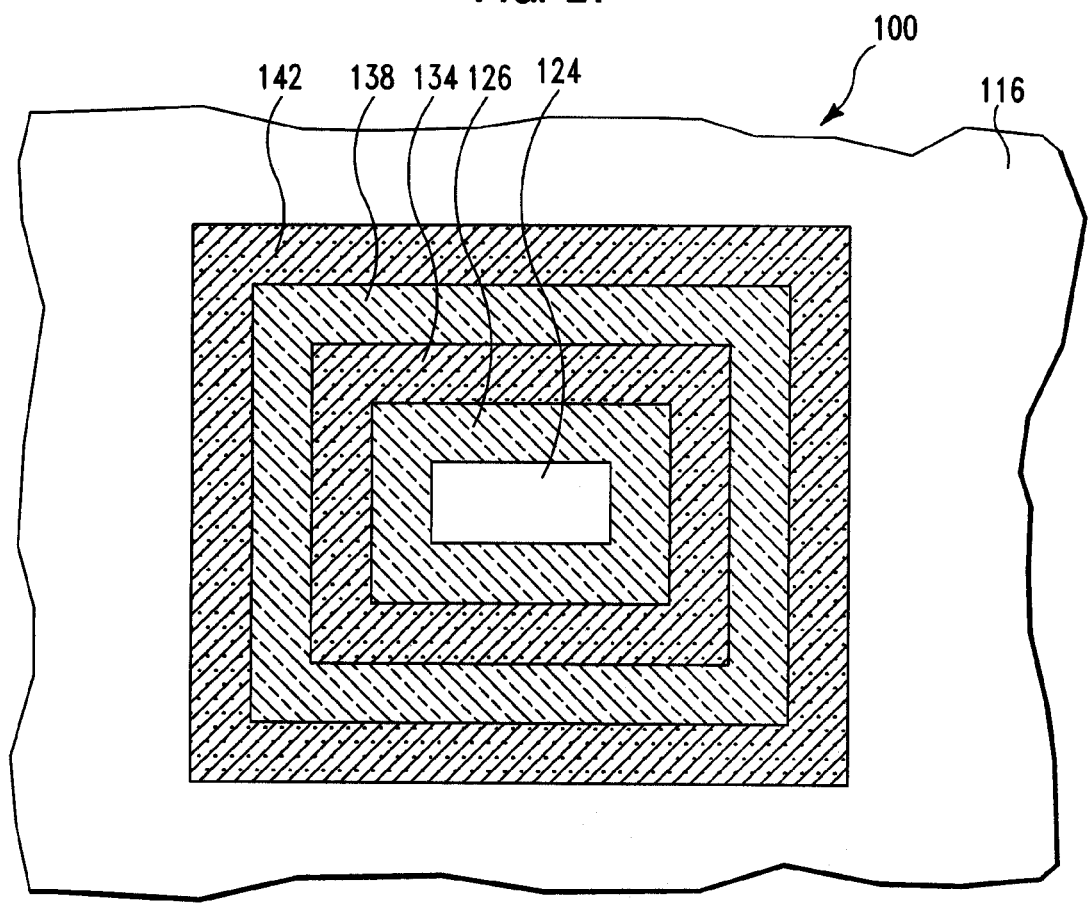
FIG. 22 depicts a top view of the structure of FIG. 21 following deposition of the heavily doped material.

A fourth trench 140 is formed around the perimeter of the second high impedance noise isolation 138, as illustrated in FIG. 20. The fourth trench 140 is formed by lithographically patterning and dry etching, e.g., RIE, etc., the upper semi-conductive layer 116 of the SOI 100, the buried oxide layer 114 and the second heavily doped layer 120, down to, and stopping at, the first heavily doped layer 118. The fourth trench 140 is then filled with a heavily doped material, such as p+ silicon doped with B, etc., or a conductive material, e.g., tungsten, etc. The surface of the structure is planarized down to the surface of the upper semi-conductive layer 116 of the structure using a CMP, or other similar technique. The combination of the fourth trench 140 filled with the heavily doped material and the first heavily doped layer 118 form a second low impedance ground path 142, (FIG. 21, a cross-sectional view; and FIG. 22, a top view).

Figure 23:
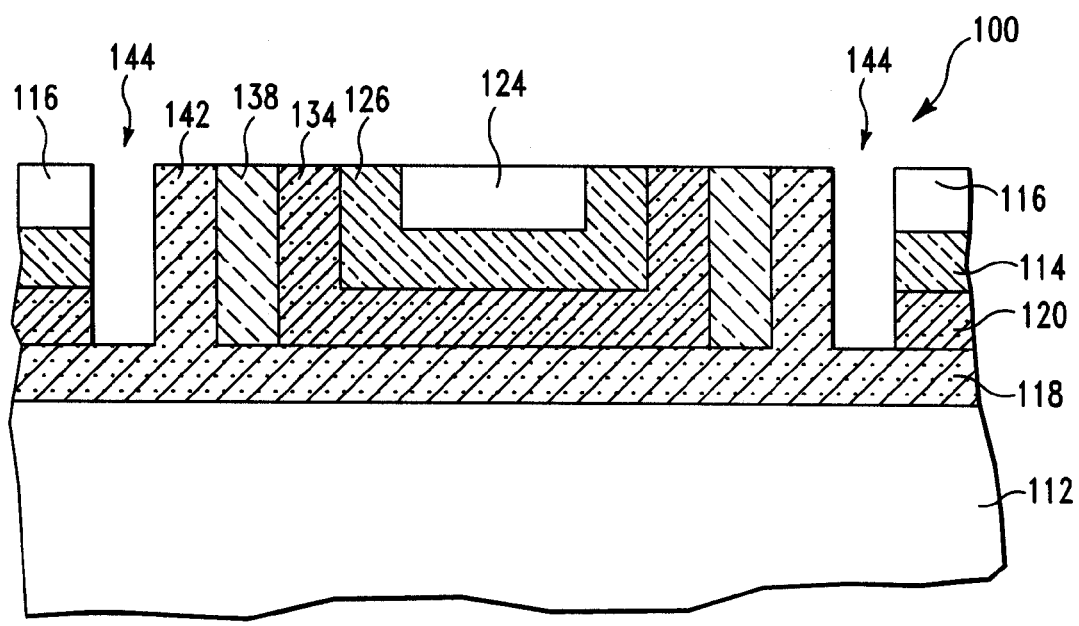
FIG. 23 depicts the structure of FIG. 22 following formation of a fifth trench.
Figure 24:
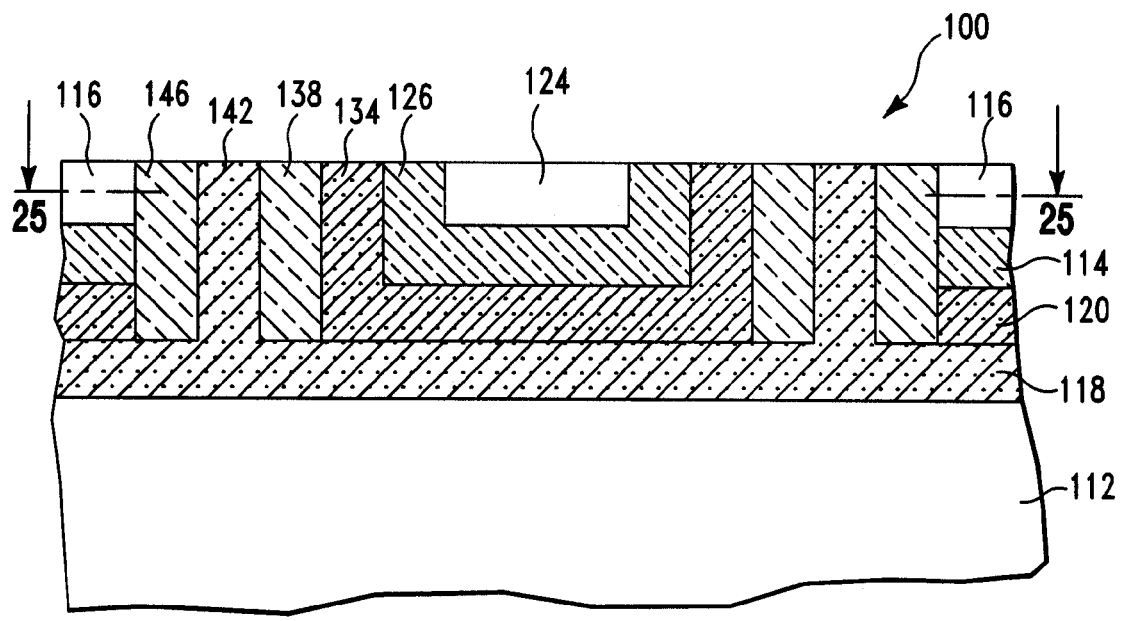
FIG. 24 depicts the structure of FIG. 23, following deposition of an insulative material.
Figure 25:
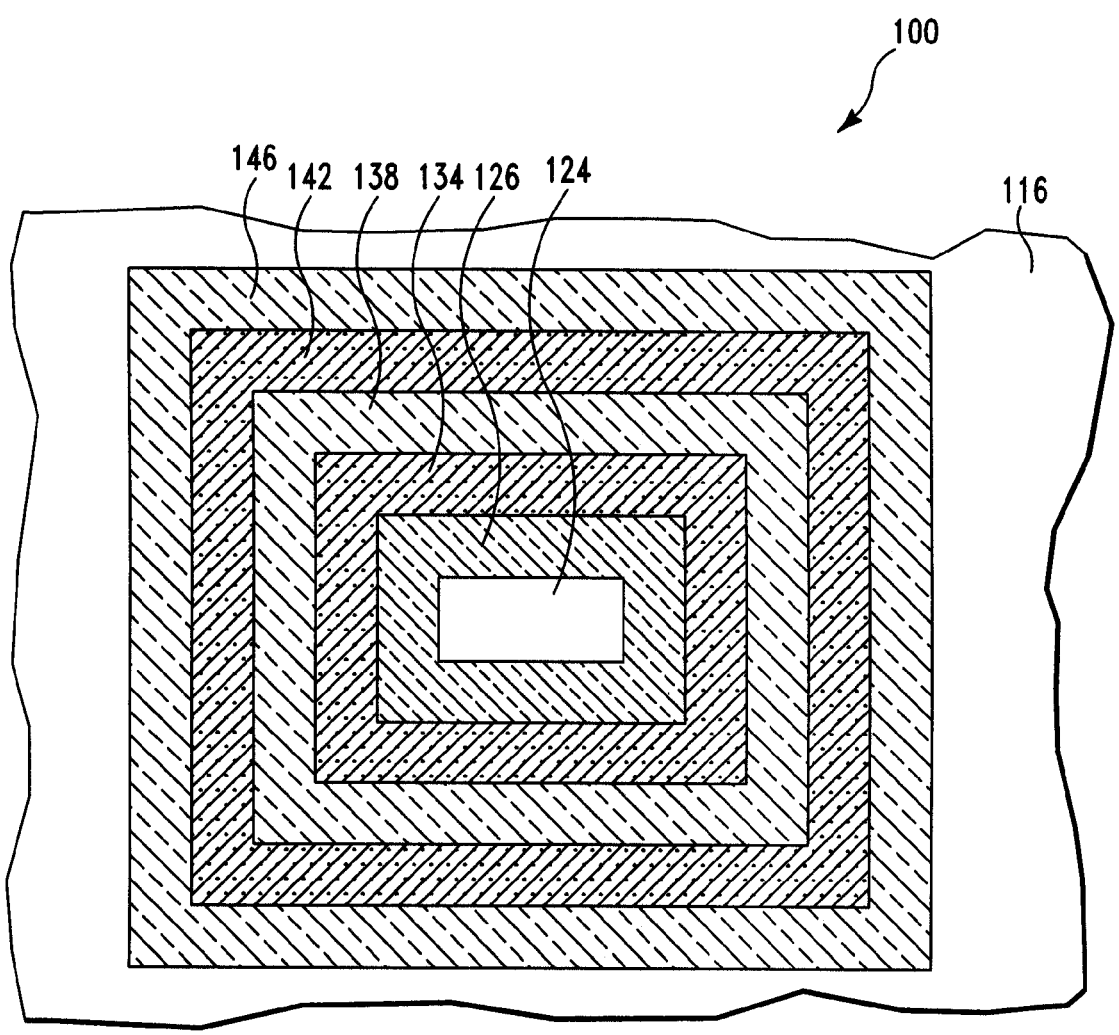
FIG. 25 depicts a top view of the structure of FIG. 24 following deposition of the insulative material.

A fifth trench 144 is formed around the perimeter of the second low impedance ground path 142, as illustrated in FIG. 23. The fifth trench 144 is formed by lithographically patterning and dry etching, e.g., RIE, etc., the upper semi-conductive layer 116 of the SOI 100, the buried oxide layer 114 and the second heavily doped layer 120, down to, and stopping at, the first heavily doped layer 118. The fifth trench 144 is then filled with an insulative material, such as $SiO_2$, etc. The surface of the structure is planarized down to the surface of the upper semi-conductive layer 116 of the structure using a CMP, or other similar technique, to form a third high impedance noise isolation 146, (FIG. 24, a cross-sectional view; and FIG. 25, a top view).

The first low impedance ground path 134, comprising the n+ doped material, is connected to +V, while the second low impedance ground path 142, comprising the p+ doped material, is connected to 0V, or ground. A deplete layer, as described above, is formed between the first and the second heavily doped layers 118, 120 due to the p+ and n+ doped material within the first and second heavily doped layers 118, 120, respectively, which aids in stopping low frequency noise.

As a whole, the structure acts as a four-stage noise reduction filter. In particular, the first heavily doped layer (p+) 118 is a low impedance ground path 142 and bypasses the noise to a constant 0V; the deplete layer created between the first and second heavily doped layers 118, 120 provides a high impedance noise isolation to stop residual noise; the second heavily doped layer (n+) 120 is another low impedance ground path 134 and bypasses the noise to a constant +V; and the insulative material within the first trench provides a first high impedance noise isolation 126.

Figure 26:
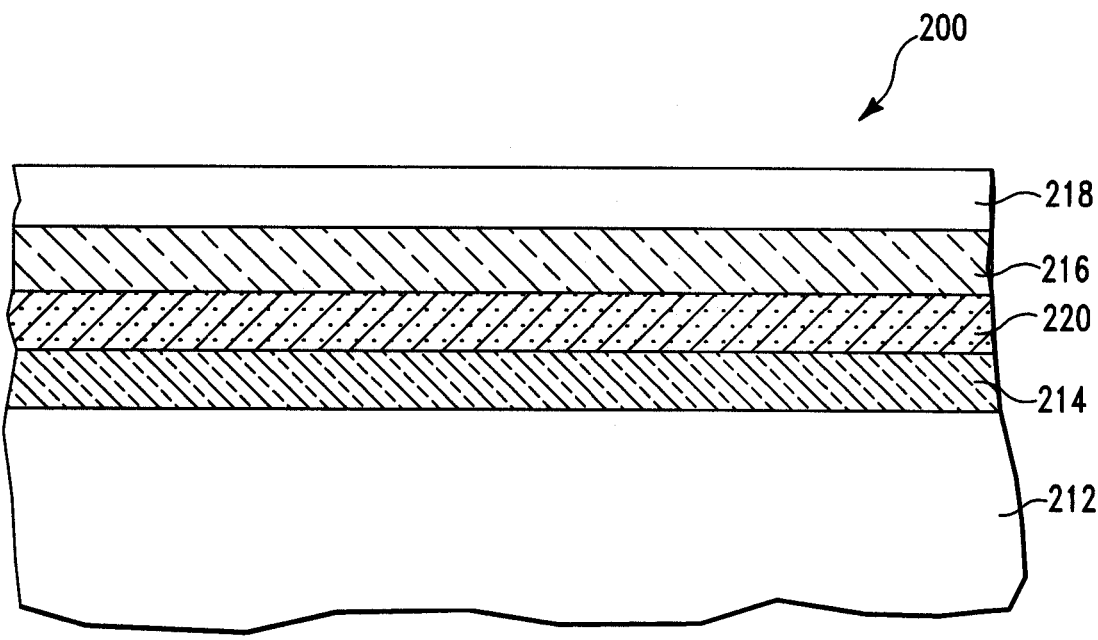
FIG. 26 depicts a cross-sectional view of a structure comprising a silicon-on-insulator (SOI) structure, having two buried oxide layers and a heavily doped layer in accordance with a third embodiment of the present invention.

In accordance with a third embodiment of the present invention, an SOI 200 comprising an semi-conductive substrate 212, such as silicon (p– or n–), a first buried oxide layer 214, such as silicon dioxide, a second buried oxide layer 216, such as silicon dioxide, and an upper semi conductive layer 218 above the second buried oxide layer 216, that may comprise the same material as the substrate 212, are formed (FIG. 26). A heavily doped layer 220 is then formed between the first isolation layer 214 and the second buried oxide layer 216. The heavily doped layer 220 may comprise silicon (p+ or n+) doped with As, P, B, or other similarly used material. One method of forming the SOI structure 200 is to implant oxygen ions twice, each time with different implant energies. The higher energy oxygen ions are implanted within the deeper, or second buried oxide, layer 216 and the lower energy oxygen ions are implanted within the shallower, or first buried oxide, layer 214. Arsenic, P, B, or other similarly used ions are implanted between layers 214 and 216 to form the heavily doped layer 220. A higher temperature anneal step may be performed such that oxygen and silicon atoms react completely with one another to form silicon dioxide layers 214 and 216.

Another possible method of forming the SOI structure 200 is to grow a heavily doped epitaxy layer of silicon film over the standard single SOI substrate and subsequently partially oxidizing the heavily doped layer to form silicon dioxide layer 214 on the wafer surface. The remaining un-reacted silicon epitaxy film forms the heavily doped layer 220. The silicon dioxide layer from the standard single SOI substrate is employed as the deeper oxide layer 216 in the double SOI structure 200. After oxide layer 214 is formed, the wafer is bonded with another wafer and a thin layer of crystalline silicon is transferred through a wafer-to-wafer bonding technique.

Figure 27:
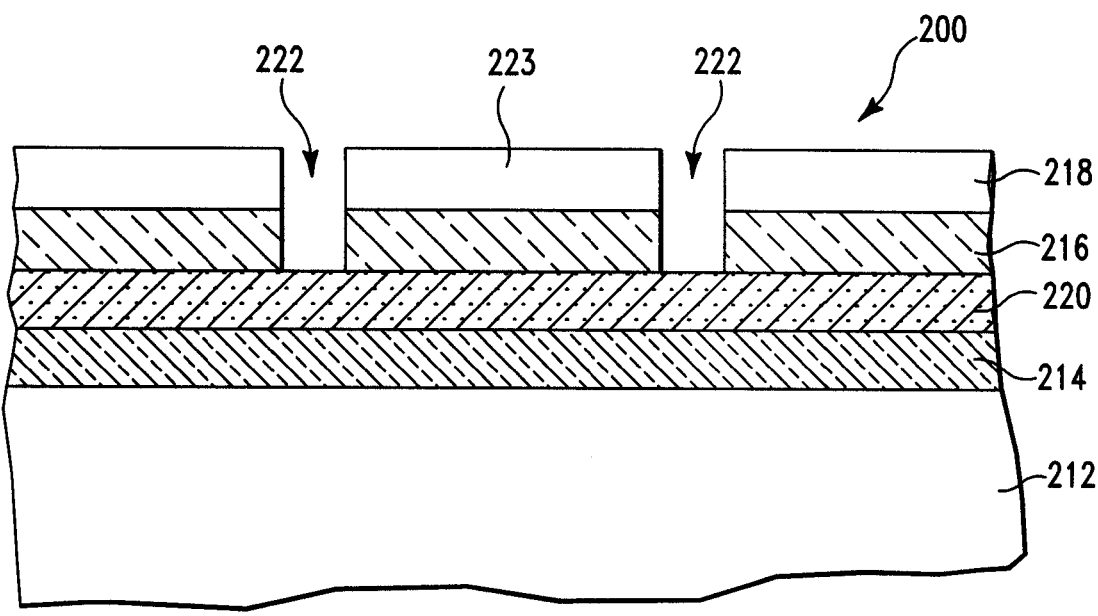
FIG. 27 depicts the structure of FIG. 26 following formation of a first trench.
Figure 28:
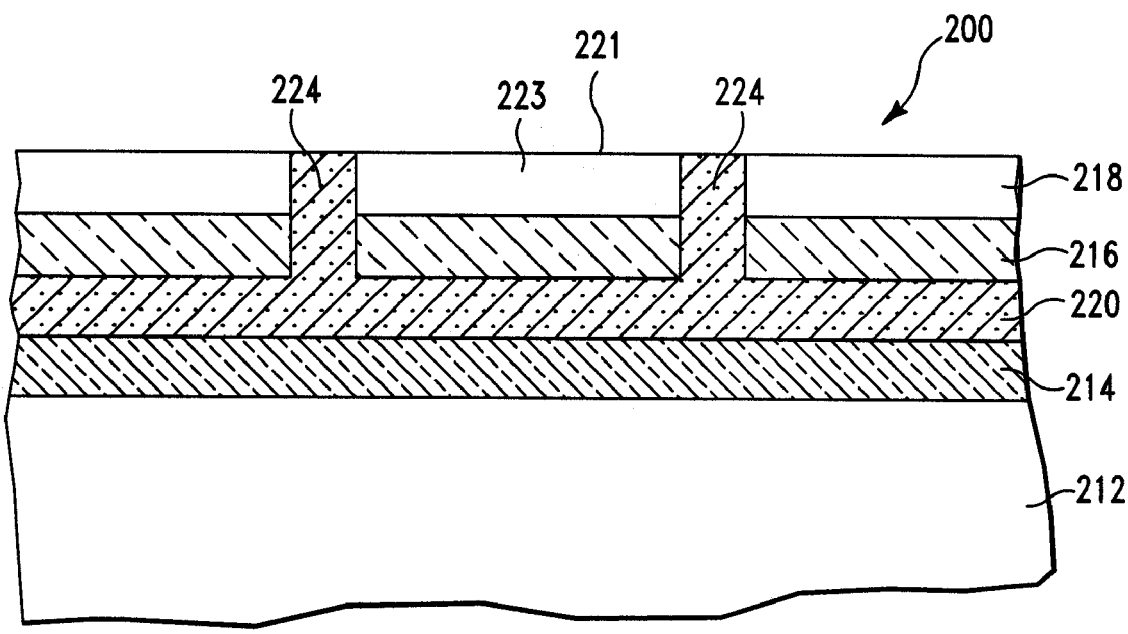
FIG. 28 depicts the structure of FIG. 27 following deposition of a heavily doped material.
Figure 29:
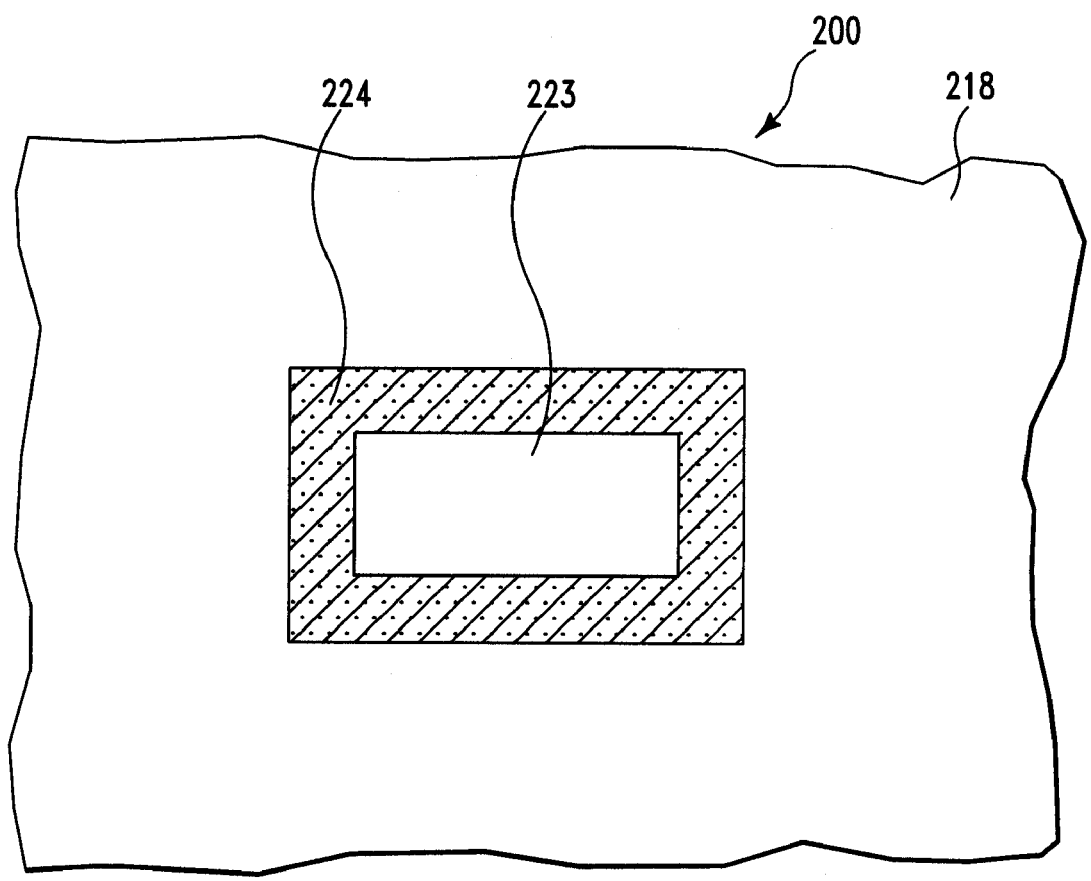
FIG. 29 depicts a top view of the structure of FIG. 28 following deposition of the heavily doped material.

A first trench 222 is formed within the SOI 200 by lithographically patterning and dry etching, e.g., RIE, etc., the upper semi-conductive layer 218 of the SOI 200 and the second buried oxide layer 216, down to, and stopping at, the heavily doped layer 220 (FIG. 27). The first trench 222 surrounds a protected area 223. The first trench 222 is then filled with a heavily doped material, such as silicon (p+ or n+) doped with As, P, B, etc., or a conductive material, e.g., tungsten, etc. The surface of the structure is planarized down to the surface of the upper semi-conductive layer 218 of the structure using a CMP, or other similar technique. The combination of the first trench 222 filled with the heavily doped material and the heavily doped layer 220 form a low impedance ground path 224 that surrounds the protected area 223 on all sides or surfaces except one side 221, in this example, on the bottom and four walls of the protected area 223, (FIG. 28, a cross-sectional view; FIG. 29, a top view). The low impedance ground path 224 is connected to 0V to bypass remaining substrate noise to the ground.

Figure 30:
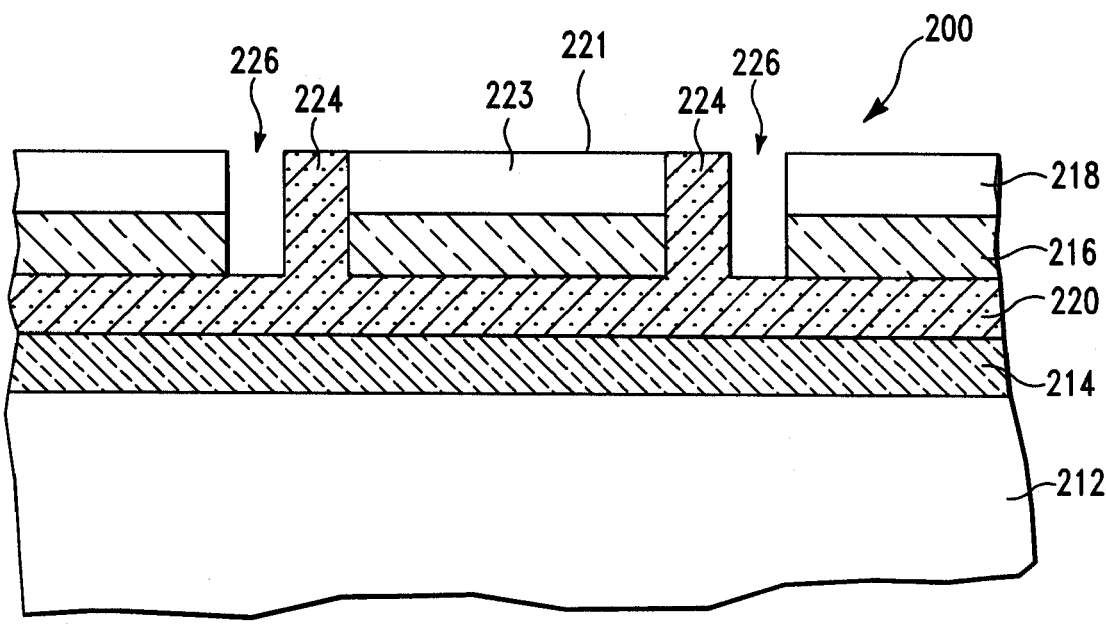
FIG. 30 depicts the structure of FIG. 28 following formation of a second trench.
Figure 31:
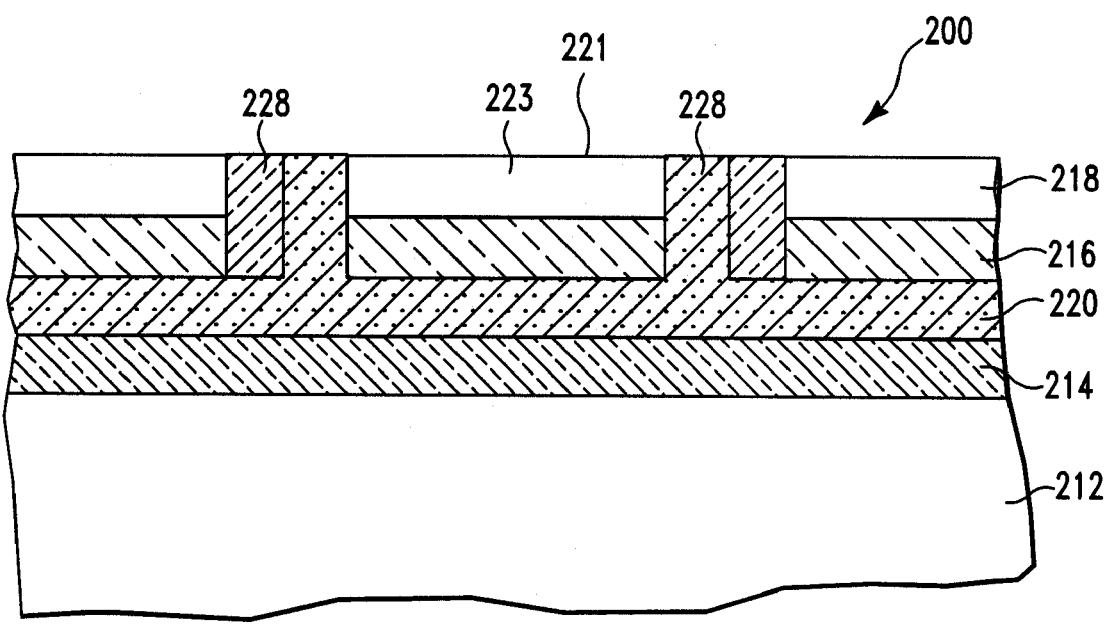
FIG. 31 depicts the structure of FIG. 30 following deposition of an insulative material.
Figure 32:
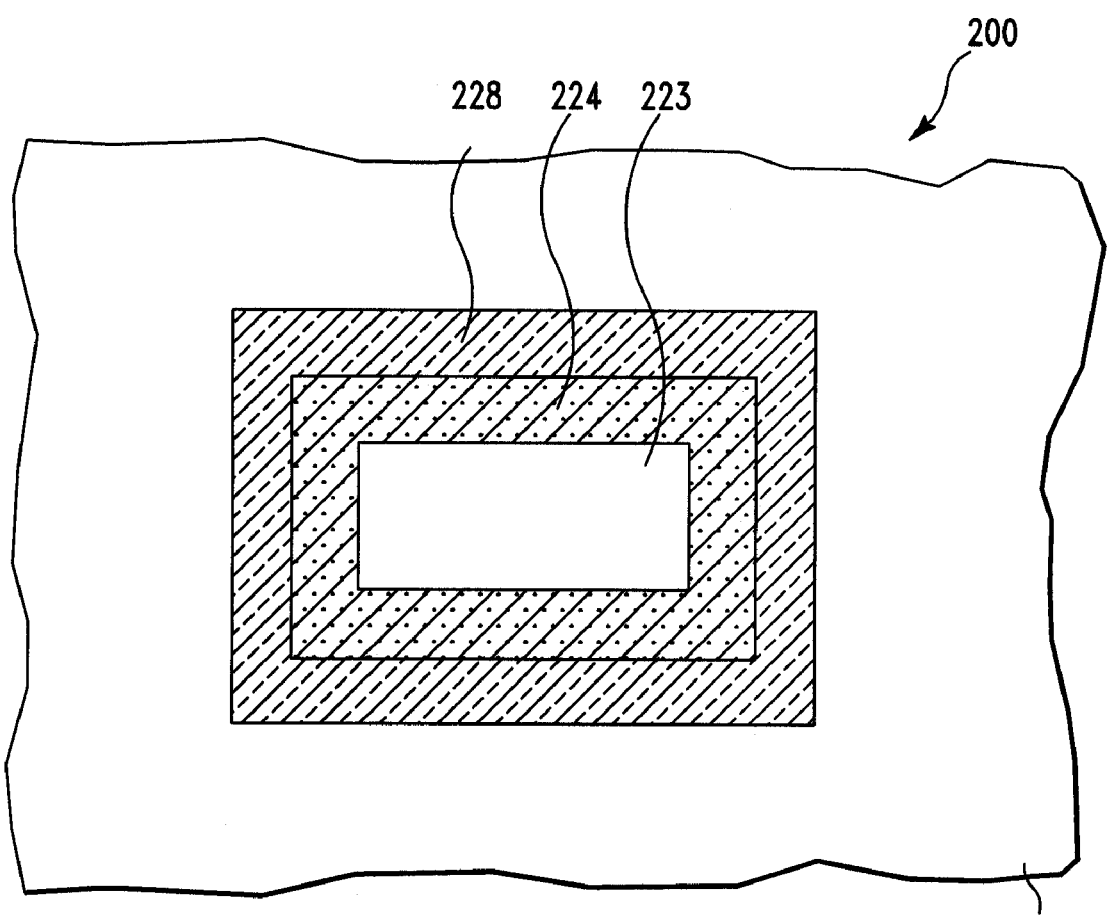
FIG. 32 depicts a top view of the structure of FIG. 31 following deposition of the insulative material.

A second trench 226 is formed within the SOI 200 by lithographically patterning and dry etching, e.g., RIE, etc., the upper semi-conductive layer 218 of the SOI 200 and the second buried oxide layer 216, down to, and stopping at, the heavily doped layer 220. The second trench 226 surrounds the perimeter of the low impedance ground path 224 (FIG. 30). The second trench 226 is then filled with an insulative material, such as SiO$_2$, etc. The surface of the structure is planarized down to the surface of the upper semi-conductive layer 218 of the structure using a CMP, or other similar technique, to form a second high impedance noise isolation 228, (FIG. 31, a cross-sectional view; FIG. 32, a top view), wherein the first high impedance noise isolation is formed by the second buried oxide layer 216 (FIG. 31).

As described in accordance with the first, second and third embodiments, the present invention provides a noise reduction isolation system, comprising at least two noise impedance isolations, a high impedance noise isolation and a low impedance ground path, that reduces the amount of noise that reaches a protected area. It should be noted that the noise reduction isolations surround the protected area on all sides or surfaces except one side of the protected area, in the present examples, on the bottom and the four walls of the protected area. In the present examples the protected area, high impedance isolations and low impedance ground paths where formed in a square or rectangular shape, such that the high impedance isolations and low impedance ground paths surrounded the protected area on four sides and a bottom surface. It should be noted that the present invention does not restrict the shape or size of the protected area of the high impedance isolations and low impedance ground paths surrounding the protected area.

What is claimed is:

1. A method of forming a semiconductor structure, comprising:
   providing a substrate having a buried insulative layer;
   forming a first heavily doped layer within the substrate beneath and in direct physical contact with a bottom surface of the buried insulative layer;
   forming a semi-conductive layer on a top surface the buried insulative layer such that a bottom surface of the semi-conductive layer is in direct physical contact with a top surface the buried insulative layer;
   forming a first trench in only the semi-conductive layer and extending through a total thickness of the semi-conductive layer, wherein the first trench surrounds a protected area consisting of a portion of the semi-conductive layer;
   filling the first trench with a first insulative material, wherein the first trench filled with the first insulative material and the buried insulative layer combine to form a first high impedance noise isolation that surrounds and is in direct physical contact with the protected area on all sides except one side of the protected area to isolate noise from the protected area.

2. A method of forming a semiconductor structure, comprising:
   providing a substrate having a buried insulative layer;
   forming a first heavily doped layer within the substrate beneath the buried insulative layer;
   forming a first trench within the substrate around a protected area;
   filling the first trench with a first insulative material, wherein the first trench filled with the first insulative material and the buried insulative layer combine to form a first high impedance noise isolation that surrounds the protected area on all sides except one side of the protected area to isolate noise from the protected area;
   forming a second trench within the substrate around the first trench;
   filling the second trench with a first conductive material, wherein the second trench filled with the first conductive material and the first heavily doped layer combine to form a low impedance ground path that surrounds the first high impedance noise isolation on all sides except one side of the first high impedance noise isolation to isolate noise from the protected area;
   after filling the second trench with the conductive material, forming a third trench within the substrate around the second trench; and
   filling the third trench with a second insulative material, wherein the third trench filled with the second insulative material forms a second high impedance noise isolation around the low impedance ground path.

3. The method of claim 2, further comprising:
   forming a second heavily doped layer within the substrate beneath and in direct physical contact with the first heavily doped layer;
   forming a fourth trench within the substrate around the third trench;
   filling the fourth trench with a second conductive material, wherein the fourth trench filled with the second conductive material and the second heavily doped layer combine to form a second low impedance ground path that surrounds the second high impedance noise isolation and the protected area on all sides except one side of the second high impedance noise isolation and the protected area;

forming a fifth trench within the substrate around the fourth trench; and filling the fifth trench with a third insulative material, wherein the fifth trench filled with the third insulative material forms a third high impedance noise isolation around the second low impedance ground path.

4. The method of claim 1, further comprising:

forming a second trench around the first trench, wherein the second trench extends through a total thickness of the semi-conductive layer and a total thickness of the buried insulative layer;

filling the second trench with a first conductive material, wherein the second trench filled with the first conductive material and the first heavily doped layer combine to form a low impedance ground path that surrounds and is in direct physical contact with the first high impedance noise isolation on all sides except one side of the first high impedance noise isolation to isolate noise from the protected area.

5. The method of claim 4, further comprising:

forming a third trench around the second trench, wherein the third trench extends through the total thickness of the semi-conductive layer, the total thickness of the buried insulative layer, and a total thickness of the first heavily doped layer; and filling the third trench with a second insulative material, wherein the third trench filled with the second insulative material forms a second high impedance noise isolation around the low impedance ground path.

6. The method of claim 5, further comprising:

forming a second heavily doped layer within the substrate beneath and in direct physical contact with the first heavily doped layer;

forming a fourth trench around the third trench, wherein the fourth trench extends through the total thickness of the semi-conductive layer, the total thickness of the burial insulative layer, and the total thickness of the first heavily doped layer;

filling the fourth trench with a second conductive material, wherein the fourth trench filled with the second conductive material and the second heavily doped layer combine to form a second low impedance ground path that surrounds the second high impedance noise isolation and the protected area on all sides except one side of the second high impedance noise isolation and the protected area.

7. The method of claim 4, wherein a first sidewall of the second trench consists of a material of the heavily doped layer, a material of the buried insulative layer, and the conductive material of the second trench, wherein a second sidewall of the second trench consists of the material of the heavily doped layer, the material of the buried insulative layer, and a material of the semi-conductive layer, and wherein the first and second sidewalls of the second trench are opposite each other.

8. The method of claim 4, wherein the substrate comprises p– silicon, and wherein the first heavily doped layer and the second trench each comprise n+ polysilicon.

9. The method of claim 1, wherein the substrate comprises a semiconductive material selected from the group consisting of a p+ semiconductive material and a n+ semiconductive material, and wherein the first heavily doped layer comprises the semiconductive material.

10. The method of claim 1, wherein the substrate comprises a semiconductive material selected from the group consisting of p– silicon and n– silicon, and wherein the semi-conductive layer comprises the semiconductive material.

11. A semiconductor structure, comprising:

a substrate having a burial insulative layer;

a first heavily doped layer within the substrate beneath the buried insulative layer;

a first trench within the substrate around a protected area, wherein the first trench is filled with a first insulative material, wherein the first trench filled with the first insulative material and the buried insulative layer combine to form a first high impedance noise isolation that surrounds the protected area on all sides except one side of the protected area to isolate noise from the protected area;

a second trench within the substrate around the first trench, wherein the second trench is filled with a first conductive material, wherein the second trench filled with the first conductive material and the first heavily doped layer combine to form a low impedance ground path that surrounds the first high impedance noise isolation on all sides except one side of the first high impedance noise isolation to isolate noise from the protected area; and a third trench within, the substrate around the second trench, wherein the third trench is filled with a second insulative material, and wherein the third trench filled with the second insulative material forms a second high impedance noise isolation around the low impedance ground path.

12. The semiconductor structure of claim 11, further comprising;

a second heavily doped layer within the substrate beneath and in direct physical contact with the first heavily doped layer;

a fourth trench within the substrate around the third trench, wherein the fourth trench is filled with a second conductive material, and wherein the fourth trench filled with the second conductive material and the second heavily doped layer combine to form a second low impedance ground path that surrounds the second high impedance noise isolation and the protected area on all sides except one side or the second high impedance noise isolation and the protected area; and a fifth trench within the substrate around the fourth trench, wherein the fifth trench is filled with a third insulative material, and wherein the fifth trench filled with the third insulative material forms a third high impedance noise isolation around the second low impedance ground path.

13. A semiconductor structure, comprising:

a substrate having a buried insulative layer;

a first heavily doped layer within the substrate beneath and in direct physical contact with a bottom surface of the buried insulative layer;

a semi-conductive layer on a top surface the buried insulative layer such that a bottom surface of the semi-conductive layer is in direct contact with a top surface the buried insulative layer; and a first trench in only the semi-conductive layer and extending through a total thickness of the semi-conductive layer, wherein the first trench surrounds a protected area consisting of a portion of the semi-conductive layer, wherein the first trench is filled with a first insulative material, and wherein the first trench filled with the first insulative material and the buried insulative layer combine to form a high impedance noise isolation that surrounds and is in direct physical contact with the protected area on all sides except one side of the protected area to isolate noise from the protected area.

14. The semiconductor structure of claim 13, further comprising a second trench around the first trench, wherein the second trench extends through a total thickness of the semi-conductive layer and a total thickness of the buried insulative layer, wherein the second trench is filled with a first conductive material, and wherein the second trench filled with the first conductive material and the first heavily doped layer combine to form a low impedance ground path that surrounds and is in direct physical contact with the first high impedance noise isolation on all sides except one side of the first high impedance noise isolation to isolate noise from the protected area.

15. The semiconductor structure of claim 14, further comprising a third trench around the second trench, wherein the third trench extends through the total thickness of the semi-conductive layer, the total thickness of the buried insulative layer, and a total thickness of the first heavily doped layer, wherein the third trench is filled with a second insulative material, and wherein the third trench filled with the second insulative material forms a second high impedance noise isolation around the low impedance ground path.

16. The semiconductor structure of claim 15, further comprising: a second heavily doped layer within the substrate beneath and in direct physical contact with the first heavily doped layer; and
a fourth trench around the third trench, wherein the fourth trench extends through the total thickness of the semi-conductive layer, the total thickness of the buried insulative layer, and the total thickness of the first heavily doped layer, wherein the fourth trench is filled with a second conductive material, and wherein the fourth trench filled with the second conductive material and the second heavily doped layer combine to form a second low impedance ground path that surrounds the second high impedance noise isolation and the protected area on all sides except one side of the second high impedance noise isolation and the protected area.

17. The semiconductor structure of claim 14, wherein a first sidewall of the second trench consists of a material of the heavily doped layer, a material of the buried insulative layer, and the conductive material of the second trench, wherein a second sidewall of the second trench consists of the material of the heavily doped layer, the material of the buried insulative layer, and a material of the semi-conductive layer, and wherein the first and second sidewalls of the second trench are opposite each other.

18. The semiconductor structure of claim 14, wherein the substrate comprises p– silicon, and wherein the first heavily doped layer and the second trench each comprise n+ polysilicon.

19. The semiconductor structure of claim 13, wherein the substrate comprises a semiconductive material selected from the group consisting of a p+ semiconductive material and a n+ semiconductive material, and wherein the first heavily doped layer comprises the semiconductive material.

20. The semiconductor structure of claim 13, wherein the substrate comprises a semiconductive material selected from the group consisting of p– silicon and n– silicon, and wherein the semi-conductive layer comprises the semi conductive material.

* * * * *